(12) United States Patent
Morishita

(10) Patent No.: US 6,855,935 B2
(45) Date of Patent: Feb. 15, 2005

(54) ELECTROMAGNETIC WAVE DETECTOR

(75) Inventor: Masakazu Morishita, Hiratsuka (JP)

(73) Assignee: Canon Kabushiki Kaisha, Tokyo (JP)

(*) Notice: Subject to any disclaimer, the term of this patent is extended or adjusted under 35 U.S.C. 154(b) by 261 days.

(21) Appl. No.: 09/816,360

(22) Filed: Mar. 26, 2001

(65) Prior Publication Data

US 2001/0038075 A1 Nov. 8, 2001

(30) Foreign Application Priority Data

Mar. 31, 2000 (JP) .......................... 2000-099011

(51) Int. Cl.$^7$ .......................... G01T 1/24; H01L 25/00; H01L 27/00
(52) U.S. Cl. .......................... 250/370.09; 250/370.08
(58) Field of Search .......................... 250/370.08, 370.09

(56) References Cited

U.S. PATENT DOCUMENTS

| | | | |
|---|---|---|---|
| 5,198,673 A | 3/1993 | Rougeot et al. | 250/370.11 |
| 5,283,428 A | 2/1994 | Morishita et al. | 250/214.1 |
| 5,391,881 A | 2/1995 | Jeuch et al. | 250/370.09 |
| 5,412,243 A | 5/1995 | Morishita | 257/462 |
| 5,508,550 A | 4/1996 | Morishita et al. | 257/357 |
| 5,777,335 A | 7/1998 | Mochizuki et al. | 250/370.09 |
| 5,793,047 A | 8/1998 | Kobayashi et al. | 250/370.09 |
| 5,811,790 A | 9/1998 | Endo et al. | 250/208.1 |
| 5,852,296 A * | 12/1998 | Tsukamoto et al. | 250/370.09 |
| 5,856,699 A | 1/1999 | Hayashi et al. | 257/433 |
| 5,869,837 A * | 2/1999 | Huang | 250/370.09 |
| 6,075,248 A * | 6/2000 | Jeromin et al. | 250/370.09 |
| 6,075,256 A | 6/2000 | Kaifu et al. | 257/53 |

FOREIGN PATENT DOCUMENTS

| | | |
|---|---|---|
| JP | 09-260626 | 10/1997 |
| JP | 09-288184 | 11/1997 |

OTHER PUBLICATIONS

Webster, J.G., Editor, Wiley Encyclopedia of Electrical and Electronics Engineering, 1999, John Wiley & Sons, Inc., vol. 22, p. 151.*

* cited by examiner

Primary Examiner—Constantine Hannaher
Assistant Examiner—Shun Lee
(74) Attorney, Agent, or Firm—Fitzpatrick, Cella, Harper & Scinto

(57) ABSTRACT

An electromagnetic wave detector includes a conversion element for converting incident electromagnetic waves or high energy radiations into an electric charge, a storage capacitor for storing the electric charge produced by the conversion element, a thin film read transistor connected to the storage capacitor, and a thin film reset transistor also connected to the storage capacitor. To the gates of the read and reset thin film transistors are applied ON and OFF voltages at predetermined timings and these voltages are set to values such that any excessive electric charge produced in the storage period is discharged by way of the thin film reset transistor, not by way of the thin film read transistor, in the same storage period.

16 Claims, 13 Drawing Sheets

ELECTROMAGNETIC WAVE DETECTOR

BACKGROUND OF THE INVENTION

1. Field of the Invention

This invention relates to an electromagnetic wave detector for detecting electromagnetic waves or high energy radiations such as ultraviolet rays, infrared rays, rays of visible light, X rays, α rays or γ rays.

2. Related Background Art

Electromagnetic wave detectors adapted to directly or indirectly convert electromagnetic waves or high energy radiations such as ultraviolet rays, infrared rays, rays of visible light, X rays, α rays or γ rays into an electric charge by means of a semiconductor article and read the stored electric charge find applications particularly in the field of imaging apparatus.

U.S. Pat. No. 5,811,790, Japanese Patent Application Laid-Open No. 09-288184, U.S. Pat. No. 5,856,699, Japanese Patent Application Laid-Open No. 09-260626 and other patent documents describe an electromagnetic wave detector adapted to convert visible light obtained by transforming X rays or some other high energy radiations into an electric charge and read the stored electric charge.

U.S. Pat. No. 5,391,881 describes an electromagnetic wave detector adapted to directly convert electromagnetic waves or high energy radiations such as ultraviolet rays, infrared rays, rays of visible light, X rays, α rays or γ rays into an electric charge.

FIGS. 14A and 14B of the accompanying drawings show a schematic cross sectional view and a schematic plan view of a known detector having a layered structure of monocrystalline bulk X ray detecting sections and monocrystalline readout ICs.

Referring to FIGS. 14A and 14B, as high energy electromagnetic waves 108 such as X rays enter the detector, an electric charge is generated in semiconductor substrates 106 typically made of Si, GaAs, CdTe or $HgI_2$ and transferred to readout circuits 116 of integrated circuit chips 110a and 110b by way of electrodes 114, bumps 120 and electrodes 119. Electrodes 134a through 134e and electrodes 130a through 130d as well as bumps 136 are provided to connect the semiconductor substrates 106 and the integrated circuit chips 110a and 110b.

U.S. Pat. No. 5,198,673 describes a direct type sensor equipped with protection diodes. FIG. 15 of the accompanying drawings is a schematic block diagram of the read/reset circuit of a direct type sensor 160 having protection diodes as disclosed in the above patent document. Referring to FIG. 15, there are shown scan switches 222a and 222b connected to scan wires 220a and 220b and output wires 230, the latter by turn being connected to sample-and-hold amplifiers (read circuits) 235 and reset circuits 237. The scan switches are also connected to sensors 210, high voltage sources 212, storage capacitors 214 and overvoltage protection elements (protection diodes) 240.

With an electromagnetic wave detector of the above described type having a circuit configuration that comprises storage capacitors for storing the generated electric charge, from which the stored electric charge is read out, a residual electric charge can be left in the detector after reading the electric charge from the storage capacitors. Then, the residual electric charge is added to the electric charge stored in the next cycle to give rise to a problem of after image when moving images are involved. Additionally, if the storage capacitors are loaded excessively with electric charge, the excessive charge can leak out to the read circuit to give rise to a phenomenon like that of blooming in a CCD image sensor. This phenomenon is particularly remarkable when the detector detects electromagnetic waves such as X rays whose energy level is higher than visible light.

Additionally, when transistors for reading the stored electric charge are formed in a bulk by using a monocrystalline wafer, electric charges unintentionally generated by high energy electromagnetic waves in the bulk can adversely affect the transistors to make them no longer operate properly.

SUMMARY OF THE INVENTION

In view of the above circumstances, it is therefore an object of the present invention to provide an electromagnetic wave detector that operates more excellently than comparable known detectors and adapted to detect high energy electromagnetic waves effectively and efficiently.

Another object of the present invention is to provide an electromagnetic wave detector having a large imaging area at low cost than ever.

Still another object of the present invention is to provide an electromagnetic wave detector that can effectively prevent any after image and leakage of electric charges from taking place and operate without errors even when high energy electromagnetic waves enter it.

According to the invention, the above objects are achieved by providing an electromagnetic wave detector comprising conversion elements for converting incident electromagnetic waves or radiations into an electric charge; storage capacitors for storing the electric charge produced by the conversion elements; thin film read transistors connected respectively to the corresponding storage capacitors and each having a gate to which ON and OFF voltages are applied respectively in readout and storage periods; and thin film reset transistors connected respectively to the corresponding storage capacitors and each having a gate to which ON and OFF voltages are applied respectively in reset and storage periods, the OFF voltage applied to the gates of the thin film reset transistors being set to a value closer to the ON voltage applied to the gates of the thin film reset transistors than the OFF voltage applied to the gates of the thin film read transistor.

In another aspect of the invention, there is also provided an electromagnetic wave detector comprising conversion elements for converting incident electromagnetic waves or radiations into an electric charge; storage capacitors for storing the electric charge produced by the conversion elements; and thin film reset transistors connected respectively to the corresponding storage capacitors and each having a gate to which ON and OFF voltages are applied respectively in reset and storage periods, any excessive electric charge being discharged by way of the thin film reset transistors in each storage period.

Preferably, the conversion elements are adapted to absorb electromagnetic waves showing an energy level higher than visible light and convert them into an electric charge.

Preferably, the thin film read transistors and the thin film reset transistors have a non-monocrystalline semiconductor layer formed on an insulating substrate.

Preferably, the thin film read transistors and the thin film reset transistors are formed on an insulating substrate, and the conversion elements are formed on a substrate different from the insulating substrate and electrically connected to the thin film read transistors and the thin film reset transistors.

Preferably, the conversion elements comprise a semiconductor substrate having two opposite surfaces for converting electromagnetic waves into an electric charge, a common electrode arranged on the one surface of the semiconductor substrate and a plurality of electrodes formed on the other surface of the semiconductor substrate and separated from each other in correspondence to a plurality of two-dimensional pixels; the thin film read transistors and the thin film reset transistors are formed on an insulating substrate such that unit cells each including one of the thin film read transistors and one of the thin film reset transistors are arranged on the insulating substrate in correspondence to the pixels; and the semiconductor substrate and the insulating substrate form a layered structure and the plurality of electrodes and the unit cells are electrically connected between the substrates.

Preferably, the semiconductor substrate is provided in plurality and they are arranged two-dimensionally on the insulating substrate to form a layered structure and the common electrodes of the semiconductor substrates are mutually short-circuited.

Preferably, a high voltage is applied to the common electrode of the conversion elements and a shielding conductor is arranged near the common electrode.

Preferably, the thin film read transistors and the thin film reset transistors are formed on an insulating substrate provided with a driver circuit for driving the thin film read transistors and the thin film reset transistors and with a read circuit for reading signals from the thin film read transistors.

Preferably, the voltage applied to the source/drain of each of the thin film read transistors is so selected that the potential difference between the source and the drain of the thin film transistor is at least 1V or more in the initial stages of a reading operation.

DESCRIPTION OF THE PREFERRED EMBODIMENTS

Now, an electromagnetic wave detector according to the invention will be described in greater detail by referring to FIGS. 1 to 2, 3A to 3C, 4A, 4B, 5 and 6 of the accompanying drawings that schematically illustrate preferred embodiments of the invention.

Figure 1:
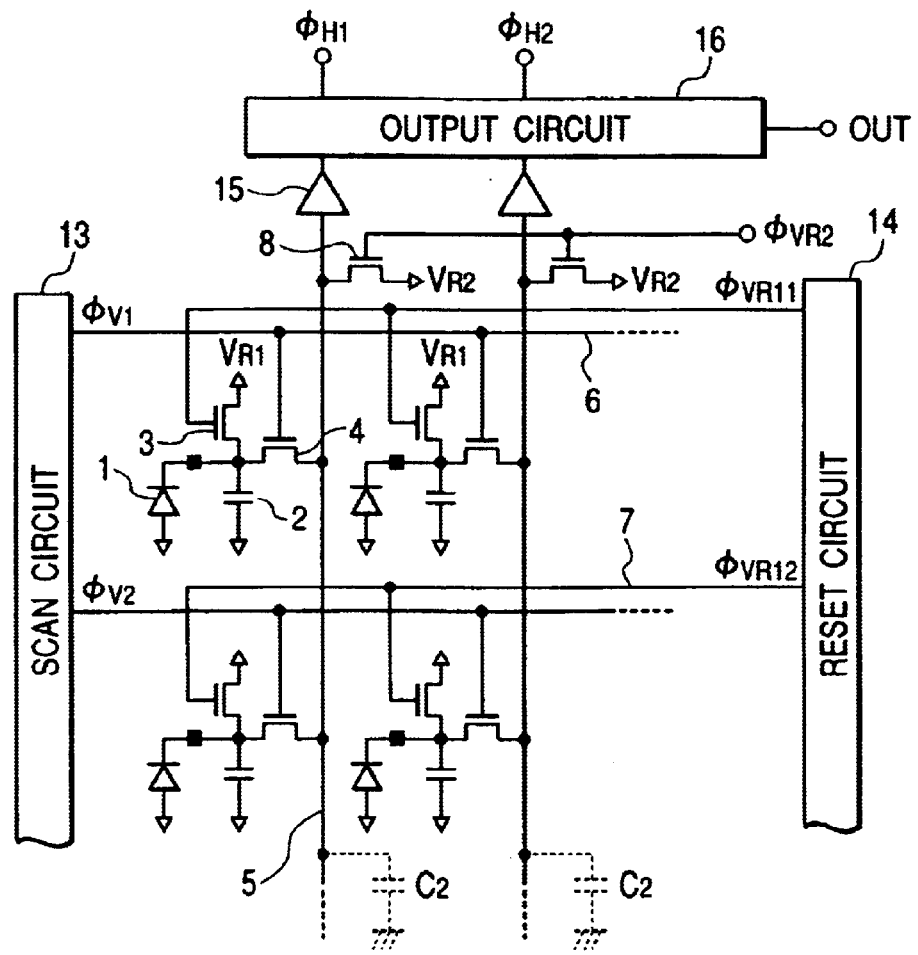
FIG. 1 is a schematic circuit diagram of an embodiment of electromagnetic wave detector according to the invention, showing its circuit configuration.

FIG. 1 is a schematic circuit diagram of an embodiment of electromagnetic wave detector according to the invention, showing its circuit configuration.

Figure 2:
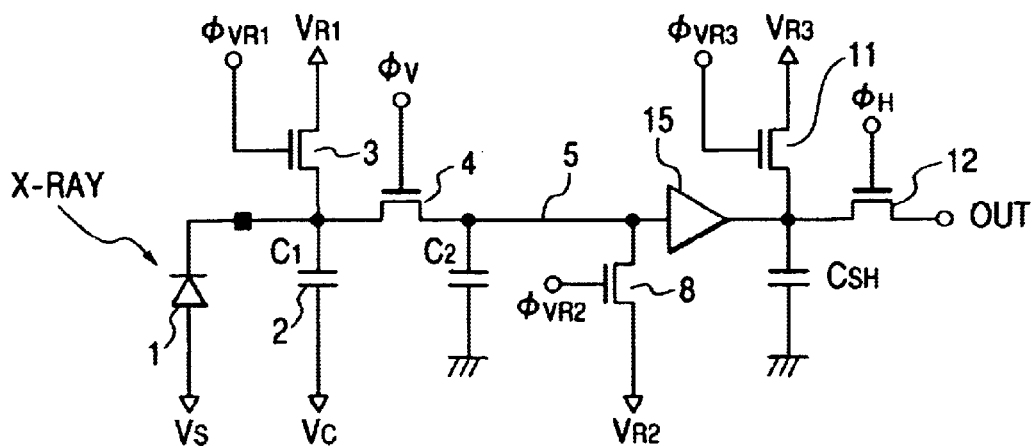
FIG. 2 is a schematic circuit diagram of a pixel of the embodiment of electromagnetic wave detector of FIG. 1, showing its circuit configuration.

FIG. 2 is a schematic circuit diagram of part of the embodiment of electromagnetic wave detector of FIG. 1, including the output circuit for reading the signal of a unit cell.

Referring to FIGS. 1 and 2, reference numerals 1 and 2 respectively denote a conversion element and a storage capacitor and reference numerals 3 and 4 respectively denote a reset transistor and a read transistor, whereas reference numerals 5 and 6 respectively denote an output line and a horizontal drive control line and reference numerals 7 and 8 respectively denote a reset control line and a reset transistor of the output line.

Reference numeral 11 denotes a reset transistor that is optionally provided if necessary and reference numerals 12 and 13 respectively denote a horizontal transfer transistor and a scan circuit, whereas reference numeral 14 denotes a reset circuit and reference numerals 15 and 16 respectively denote an amplifier and an output circuit.

A unit cell that operates as a pixel comprises a conversion element 1 for converting the electromagnetic wave that enters it into an electric charge, a storage capacitor 2 for storing the signal charge from the conversion element 1, a read transistor 4 for reading the signal from the storage capacitor 2 and a reset transistor 3 for resetting the signal charge.

Unit cells are arranged two-dimensionally in the form of matrix to operate as a so-called area image sensor.

The transistors 4 of each row are selected by way of the scan circuit 13 that operates on a row by row basis to read the signals from the storage capacitors 2 of the row to the output lines 5 and then the signals are inputted to the output circuit 16 by way of the amplifiers 15 connected to the output lines 5 so that all the read out signals are sequentially outputted to output terminal OUT on a column by column basis.

Each output line 5 is reset to reference potential $V_{R2}$ by the corresponding output line reset transistor 8. The output circuit 16 typically comprises storage capacitors showing a capacitance of $C_{SH}$ and arranged for the respective output lines 5 and transistors 12 for connecting the respective storage capacitors showing a capacitance of $C_{SH}$ to a common output line. Transfer pulses $\Phi_{H1}$, $\Phi_{H2}$, . . . are sequentially inputted to the output circuit 16 from an output scan circuit (not shown) to sequentially turn on the transistors 12 so that signals are read out from the storage capacitors showing a capacitance of $C_{SH}$ on a column by column basis to the output terminal OUT of the common output line and delivered to the outside.

The drive method of the above arrangement will be discussed in greater detail hereinafter.

Capacitance $C_2$ is generated by each output line 5. The capacitance $C_2$ includes the capacitance of the crossing areas of the corresponding output line 5 with the horizontal control lines 6 and 7 and that of the source (or drain) regions of the related transistors 4. In the case of a large device having a large substrate panel and hence adapted to cover a large area for imaging, the capacitance $C_2$ is large and significantly affects the ratio of signal S to noise N.

When the detector is formed by using a monocrystalline substrate (typically made of Si), the capacitance between the substrate and the wires is further added thereto. However, this capacitance can advantageously be reduced to the level of tens of several pF by using an insulating substrate such as a glass substrate even if the substrate is a panel as large as 20 cm×20 cm.

When electromagnetic waves are made to enter the conversion element 1, if the capacitance of the conversion element 1 is $C_0$ and the generated electric charge is Q, the voltage $V_S$ generated in the storage capacitor 2 (capacitance $C_1$) is expressed as $V_S=Q/(C_1+C_0)$.

Therefore, if $C_1 \gg C_0 (C_1 \geq 10 \cdot C_0)$, practically $V_S \cong Q/C_1$ holds true.

When reading the signal charge from the storage capacitor 2 (capacitance $C_1$) to the capacitance $C_2$, the potential of the capacitance $C_2$ is $V_{C2}=Q/(C_1+C_2)$.

Since normally $C_2 \gg C_1$, practically $V_{C2}=Q/C_2$ holds true.

Thus, differently stated, $V_{C2}/V_S=C_1/C_2$ holds true so that the signal charge is read out as voltage that varies as a function of the ratio of the capacitance $C_1$ of the capacitor 2 to the capacitance $C_2$.

Therefore, if the capacitance $C_2$ is too large, the noise of the amplifier of the reading system becomes dominant to worsen the SN ratio of the sensor.

As pointed out above, since the capacitance $C_2$ can be reduced by using an insulating substrate, the use of such a substrate is advantageous particularly when the detector has large dimensions.

Figure 3A:
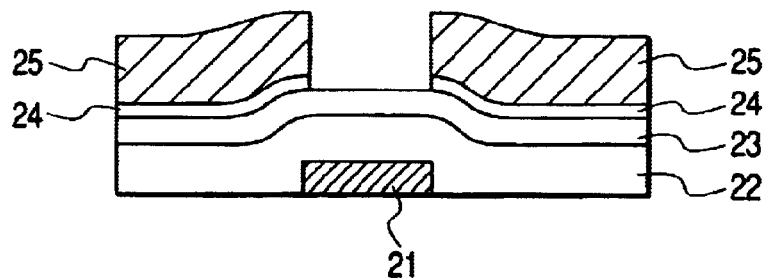
FIGS. 3A, 3B and 3C are schematic cross sectional views of thin film transistors that can be used for the purpose of the invention.
Figure 3B:
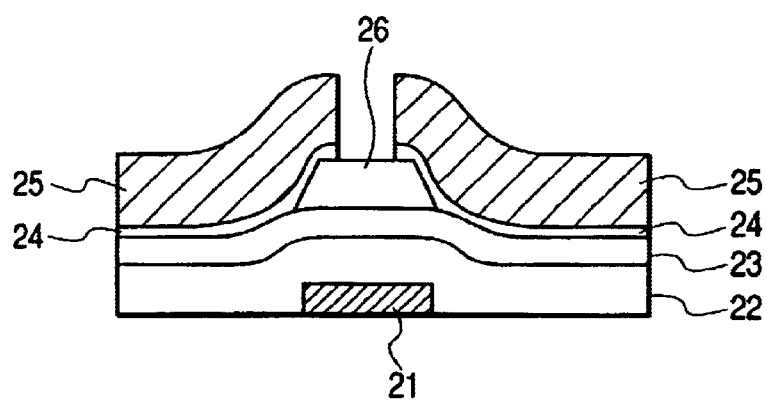
Figure 3C:
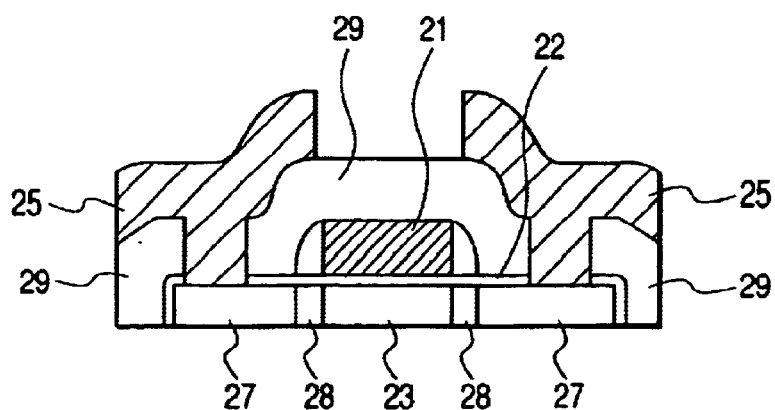

FIGS. 3A, 3B and 3C are schematic cross sectional views of typical thin film transistors that can be formed on an insulating substrate for the purpose of the invention.

FIG. 3A shows a so-called lower gate stagger type thin film transistor. Referring to FIG. 3A, reference numeral 21 denotes a gate electrode made of metal, which may be aluminum, chromium or tantalum, and reference numeral 22 denotes a gate insulating film typically made of silicon nitride, silicon oxide, aluminum oxide or tantalum oxide, whereas reference numerals 23 and 24 respectively denote a semiconductor layer of amorphous silicon or polycrystalline silicon which is adapted to form a channel and an ohmic contact layer of a highly doped N-type semiconductor material such as amorphous silicon or microcrystalline silicon and reference numeral 25 denotes a source/drain electrode made of metal such as aluminum or titanium.

FIG. 3B shows another so-called lower gate stagger type thin film transistor. The arrangement of FIG. 3B differs from that of FIG. 3A in that it additionally comprises a channel protection layer 26 for protecting the semiconductor layer 23 arranged above the gate electrode 21. The channel protection layer 26 is made of an insulating material such as silicon nitride or silicon oxide that shows an etching rate lower than that of the ohmic contact layer 24.

The arrangements of FIGS. 3A and 3B are advantageous when the semiconductor layer is made of an amorphous material such as hydrogenated amorphous silicon.

FIG. 3C shows a so-called upper gate co-planar type thin film transistor that can advantageously be adopted when a polycrystalline semiconductor such as polycrystalline silicon or a monocrystalline semiconductor such as monocrystalline silicon is used as semiconductor material for forming a channel 23, a high concentration impurity region 27 that makes a P-type or N-type source/drain region and, if necessary, a low concentration impurity region 28 for the transistor. In FIG. 3C, reference numeral 21 denotes a gate electrode typically made of polycrystalline silicon or metal and reference numeral 22 denotes a gate insulating film typically made of silicon oxide, whereas reference numeral 25 denotes a source/drain electrode and reference number 29 denotes an insulating film typically of silicon oxide or silicon nitride.

The mobility of carriers of a thin film transistor having a channel region formed by using a non-monocrystalline semiconductor such as amorphous semiconductor or polycrystalline semiconductor is low if compared with that of a thin film transistor whose channel region is formed by using a monocrystalline semiconductor. However, defective grain boundaries and dangling bonds that causes the above drawback operate to trap any electric charge that is unintentionally generated by high energy rays entering the transistor so that a thin film transistor made of a non-monocrystalline semiconductor provides an advantage that it scarcely commits operation errors.

In this embodiment, at least the reset switch 3 and the read switch 4 are prepared by using a thin film transistor of any of the above described types. At least the reset switch 3 and the read switch 4 are preferably prepared by way of a same film forming process. If necessary, thin film transistors may also be used for the transistor 8, the scan circuit 13, the reset circuit 14 and the output circuit 16.

Now, the operation of the transistor 3 that is a thin film transistor of this embodiment will be described.

After reading the electric charge from the capacitance $C_2$, an electric charge of $Q \cdot C_1/C_2$ remains in the storage capacitance $C_1$. If the storage capacitance $C_1$ is 1 pF and the capacitance $C_2$ is 40 pF, an electric charge of 2.5% is left and added to the capacitance of the next storage cycle to operate as noise at the next read session. In the case of a moving image, the remaining electric charge is remarkably visualized as after image.

In this embodiment, the remaining electric charge is reset to nil to suppress any appearance of after image by means of the transistor 3.

Additionally, in this embodiment, it is possible to discharge any excessive electric charge above the predetermined level of electric charge to be stored in the storage capacitor 2 also by means of the transistor 3. Thus, the range of electric potential (range of stored electric charge) of the storage capacitor 2 can be defined by means of the transistor 3.

The initial potential of the storage capacitor 2 that is observed immediately after a reset operation is made equal to reset reference potential $V_{R1}$ by applying a sufficient ON voltage to the transistor 3 to turning on the latter.

After the reset, the electric charge Q flowing in from the conversion element 1 is stored in the capacitor 2 and, if the charge of the capacitor 2 exceeds the predetermined level, the excessive charge can leak out to the output line 5 by way of the read transistor 4. In this embodiment, the ultimate potential (saturation potential) of the capacitor 2 that can be produced by the electric charge is defined by the gate voltage applied to the gate of the transistor 3.

If the voltage applied to the gate in order to define the gate potential $V_G$ is OFF voltage $V_B$, the ultimate potential of the capacitor 2 is defined by $V_B - V_{th}$ ($V_{th}$ being the threshold value of the transistor 3). If, for instance, $V_B = V_{th}$, the ultimate potential of the capacitor 2 is equal to zero and the range of voltage of the capacitor 2 is defined as between $V_{R1}$ and 0V.

Thus, in this embodiment, transistor 3 operates as reset switch and also as element for defining the dynamic range of the pixel.

Figure 4A:
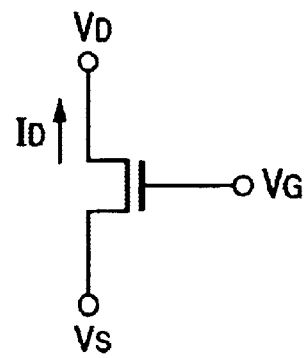
FIG. 4A is a circuit diagram of a thin film transistor that can be used for the purpose of the invention and FIG. 4B is a graph showing the characteristic performance of the thin film transistor of FIG. 4A.
Figure 4B:
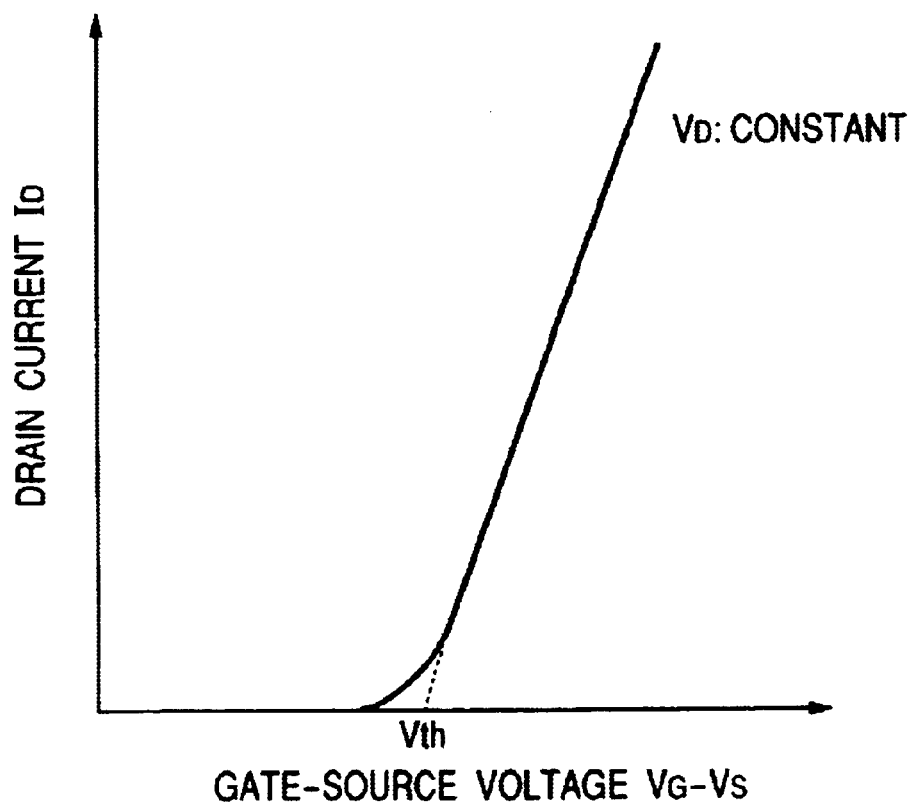

FIG. 4A is a circuit diagram of an n-channel type thin film transistor that can be used for the purpose of the invention and FIG. 4B is a graph showing the characteristic performance of the thin film transistor of FIG. 4A in terms of $V_G - V_S$ relative to $I_D$. The value of $V_{th}$ in FIG. 4B is about 2V.

If the OFF voltage $V_B$ of the gate is -1V, $V_B - V_{th} = -3V$.

The source of the transistor 3 is connected to the storage capacitor 2 and reference voltage $V_{R1}$ is applied to the drain.

If the conversion element 1 is irradiated with electromagnetic waves under this condition and the generated carrier electrons (-Q) are stored in the storage capacitor 2 (capacitance $C_1$), a negative potential appears when $V_S = -Q/C_1$. The gate-source voltage of the transistor 3 is $V_G - V_S = V_B + (Q/C_1)$ and hence it varies as a function of the stored carriers.

More specifically, when $\{VB_G + (Q/C_1)\} \geq V_{th}$, an electric current flows to the drain and the source voltage $V_S$ stops rising any further.

Under the above condition, $-Q/C_1 = -(V_{th} - V_B) = -(2+1)$V$= -3V$ and hence does not fall under $-3V$.

If the electric potential of the storage capacitor 2 is not controlled in this way, it can fall remarkably to above -20V. Then, the gate/source voltage of the read transistor 4 rises to give rise to a leak current between the gate and the source of the transistor 4 and, if the voltage rises further, the insulating film can be damaged and become broken.

Additionally, when the source/drain voltage of the transistor 4 exceeds a predetermined level (about 20V), the electric current between the source and the drain of the transistor 4 flows out even if the OFF voltage is applied to completely turn off the transistor 4 so that carriers can flow into the vertical lines of the sensor to give rise to a so-called blooming phenomenon of CCD image sensor. Differently stated, the electric charge of the storage capacitor 2 overflows by way of the transistor 4 so that the areas that are irradiated with electromagnetic waves particularly strongly produces a vertical influence. The above described embodiment of the invention can effectively suppress this phenomenon.

Now, the timings of operation of the embodiment will be described by referring to FIG. 5. The embodiment basically operates for reset, storage and readout.

Figure 5:
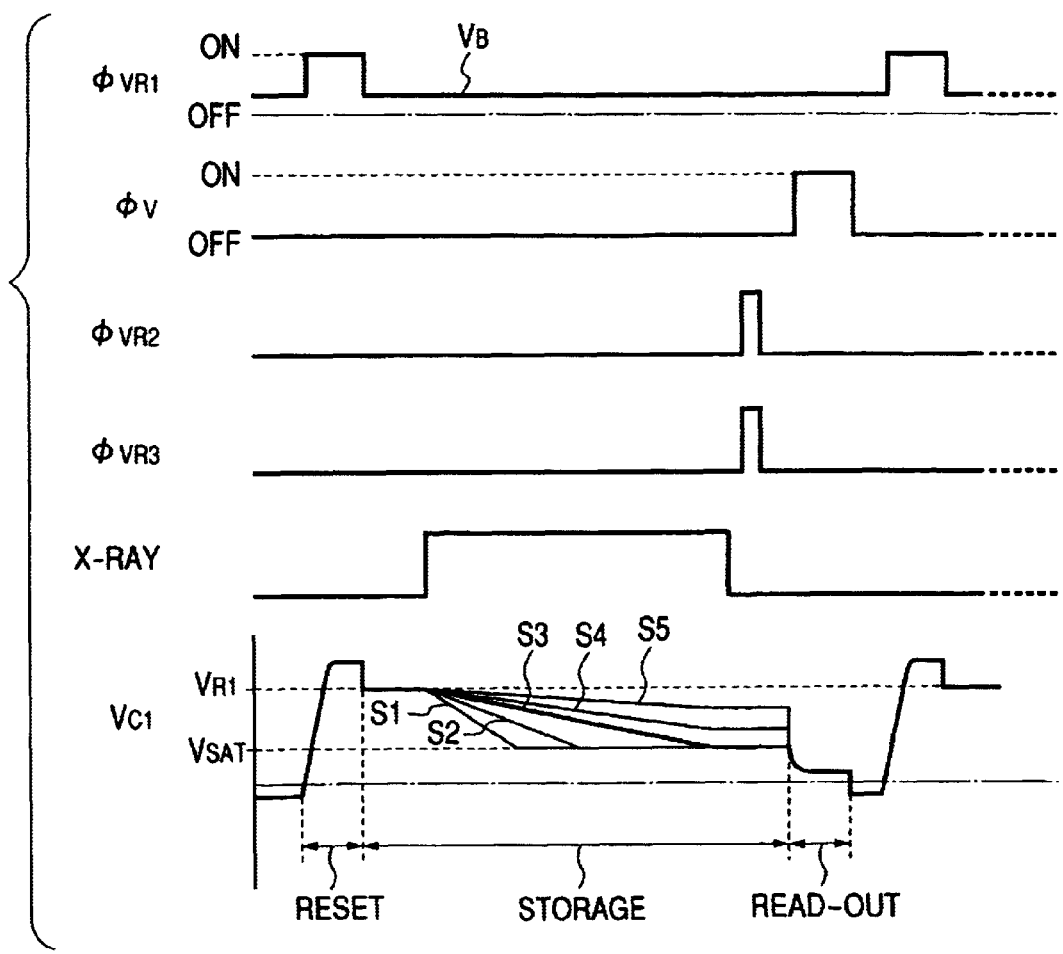
FIG. 5 is a basic drive timing chart of the embodiment of electromagnetic wave detector of FIG. 1.

Referring to FIG. 5, $\Phi_{VR1}$ denotes the voltage applied to the gate of the reset transistor 3 from the reset circuit 14. For instance, it may be so arranged for $\Phi_{VR1}$ that the high level ON voltage is about +15V and the low level OFF voltage is about +5V.

$\Phi_V$ denotes the voltage applied to the gate of the read transistor 4 from the scan circuit 13. For instance, it may be so arranged for $\Phi_V$ that the high level ON voltage is about +15V and the low level OFF voltage is about -5V.

As will be understood by comparing the OFF voltage $V_B$ of the reset transistor 3 and the OFF voltage of the read transistor 4, the OFF voltage $V_B$ of the reset transistor 3 is closer to the ON voltage side (or the positive voltage side in this instance) than the OFF voltage of the read transistor 4.

$\Phi_{VR2}$ denotes the voltage applied to the gate of the transistor 8 for resetting the capacitance $C_2$ of the output line 5 to reference potential $V_{R2}$ and $\Phi_{VR3}$ denotes the voltage applied to the gate of the transistor 11 for resetting the capacitance $C_{SH}$ to reference potential $V_{R3}$.

$V_{C1}$ denotes the potential of the floating terminal of the storage capacitor 2.

After bringing the pulse $\Phi_{VR1}$ to the high level to turn on the reset transistor 3 for reset operation, X rays as electromagnetic waves are irradiated for a predetermined period of time. Then, after bringing the pulses $\Phi_{VR2}$ and $\Phi_{VR3}$ up to the ON level and resetting the wires and the sample hold circuit, the read transistor 4 is turned on by applying the pulse $\Phi_V$ to read the signal representing the electric charge stored in the storage capacitor 2. Subsequently, the above operation will be repeated. X rays may be irradiated continuously.

In FIG. 5, S1 through S5 show changes in the voltage $V_{C1}$ that appear as a result of the changes in the intensity of the electromagnetic waves. When the electromagnetic waves are strong and a large amount of photo-generated electric charge is produced, $V_{C1}$ quickly gets to the level of saturation voltage $V_{SAT}$ as indicated by S1. On the other hand, when the intensity of the electromagnetic waves is slightly lower and the amount of photo-generated electric charge is small, $V_{C1}$ slowly gets to the level of saturation voltage as indicated by S2 and S3. There may be cases where $V_{C1}$ never gets to the level of saturation voltage as indicated by S4 and S5 depending on the intensity of electromagnetic waves. Thus, the dynamic range of the device is defined by voltage $V_{R1}$ and voltage $V_{SAT}$.

As will be understood by comparing the low level voltage of $\Phi_{VR1}$ and that of $\Phi_V$, +5V is applied to the gate of the reset transistor 3 instead of a voltage (e.g., -5V) that completely turns off the transistor 3 during a charge storing period. In other words, the transistor 3 is held to an intermediary state between the completely ON state and the completely OFF state. As a result, the electric charge can flow more easily through the reset transistor 3 than through the read transistor 4 so that any excessive charge that may be generated can be discharged through the transistor 3.

The above embodiment is advantageous when the reset transistor 3 and the read transistor 4 are made to substantially have a same configuration and show same threshold values (provided that any minor deviation of threshold value less than 1V due to the manufacturing process variation is disregarded). Particularly, the above embodiment operates effectively when all the transistors are formed on a same substrate through a same film forming process.

However, the above embodiment may be so modified as to make the reset transistor 3 and the read transistor 4 show different threshold values. For instance, either the channel of the reset transistor 3 or that of the read transistor 4 may be doped with an impurity to differentiate the extent of channel doping between the transistor 3 and the transistor 4. Assume that this technique is used and the threshold value of the gate voltage that completely turns off the reset transistor 3 is made lower than −5V while the threshold value of the gate voltage that completely turns off the read transistor 4 is made equal to −5V. Then, when a same gate voltage (e.g., −5V) is applied to the gate of the reset transistor 3 and that of the read transistor 4, the read transistor 4 is completely turned off whereas the reset transistor 3 is not completely turned off so that it is possible to discharge any excessive electric charge through the reset transistor 3 on a priority basis.

Figure 6:
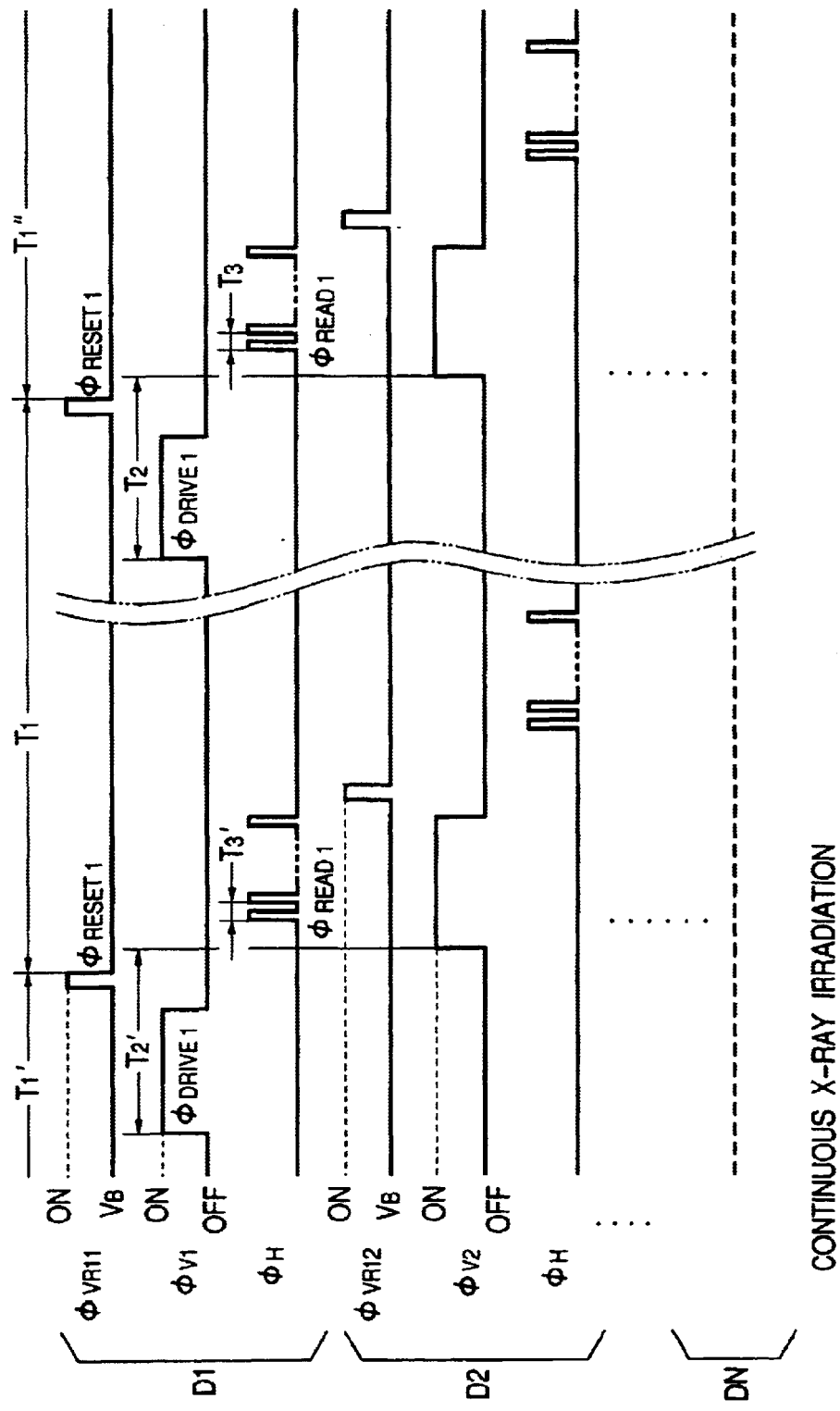
FIG. 6 is a drive timing chart of the embodiment of electromagnetic wave detector of FIG. 1.

FIG. 6 is a timing chart illustrating the operation of the above embodiment of electromagnetic wave detector. It is assumed here that the embodiment is continuously irradiated with X rays.

Referring to FIG. 6, D1, D2, . . . , DN indicate the drive operations of the respective rows. For instance, D1 indicates the timings of the 1st row. With regard to D1, $\Phi_{VR11}$ indicates the reset pulse outputted from the reset circuit 14 and $\Phi_{V1}$ indicates the drive pulse for driving all the lines of the 1st row as outputted from the scan circuit 13, while $\Phi_H$ ($\Phi_{H1}$, $\Phi_{H2}$, . . . ) indicates the read pulses outputted to the output circuit 16 from a scan circuit (not shown). With this timing arrangement of operation, the signal is sent out from the output terminal OUT to an analog/digital converter circuit (not shown) by way of an external output amplifier and stored in a memory (not shown).

As for D1, the electric potential of each storage capacitor 2 of the first row line is reset by pulse $\Phi_{RESET1}$ in period T2' and an operation of storing an electric charge is started in period T1 so that the irradiated X rays are received by the conversion element 1 that may be an X ray sensor cell and the generated electric charge is stored in the storage capacitor 2 generally throughout the period T1–T2. In this embodiment, since the potential of the storage capacitor 2 is lowered by the generated electric charge, it may be so regarded that the electric charge stored in the storage capacitor 2 is discharged by the reset operation. The transistor 4 is turned on by pulse $\Phi_{DRIVE1}$ in period T2 and the electric charge is transferred to the capacitance $C_2$ of each row. Then, the storage capacitor 2 of the first row line is reset by pulse $\Phi_{RESET1}$ in the period T2 and a storage cycle is started in the next period T1".

In parallel with the storage cycle of the period T1", the signals of the signal charges stored in the period T1 are sequentially outputted by pulse $\Phi_{READ1}$ from each row to an A/D converter circuit (not shown) by way of an output amplifier. Also in parallel with the storage cycle of the period T1", the signal charges that started to be stored by D2 in the period T1 are transferred to the capacitances $C_2$ of the columns.

Thus, the signals of all the rows are read out by D1 through DN. Note that, in FIG. 6, the all the periods T1', T1 and T1" have a same length while the periods T2' and T2 have a same length and the periods T3' and T3 have a same length.

The time length of T1 is 33 msec when images are picked up for 30 frames per second (T1≅1/30 sec). When 500×500 conversion elements are arranged to a matrix, the reading operation of D1 through D500 is required with T2≅T1/500, or about 66 μsec, and T3=T2/500, or about 130 nsec.

A read cycle ($\Phi_{DRIVE1}$) of the transistor 4 and a reset ($\Phi_{RESET1}$) take place in period T2. The signal has to be fully read because the sensor output level can be lowered otherwise. Time constant $t_{read}=C_1 \cdot Ron_R$ is defined by the capacitance $C_1$ of the storage capacitor 2 and the ON resistance $Ron_R$ of the read transistor 4. A value of $3t_{read}$ or more is desired for the signal to be fully read. It is also desired that $\Phi_{RESET}$ has a similar time length. Thus, the time constant of the reset circuit is expressed by $t_{reset}=C_1 Ron_{Reset}$. Therefore, it is desired that $T2 \geq 3C_1 (Ron_R+Ron_{Reset})$ holds true. If T2=66 μsec, $C_1 (Ron_R+Ron_{Reset}) \leq 22$ μsec will be obtained. If, on the other hand, a value of $5t_{read}$ or more is used, $C_1 (Ron_R+Ron_{Reset}) \leq 13$ μsec will hold true. It is also desired that both $Ron_R$ and $Ron_{Reset}$ are sufficiently small.

Figure 7:
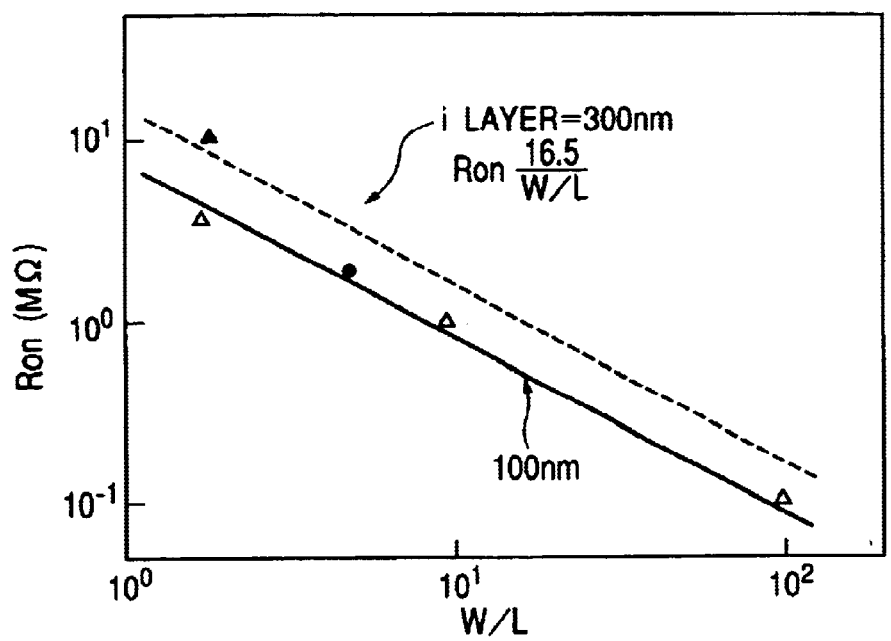
FIG. 7 is a graph showing the characteristic of ON resistance that can be used for the purpose of the invention.

FIG. 7 is a graph showing the characteristic of the ON resistance of a thin film transistor (TFT) realized by using amorphous silicon that can be used for the purpose of the invention. The thin film transistor made of amorphous silicon may have a configuration as shown in FIG. 3A or FIG. 3B. In FIG. 7, the horizontal axis represents the ratio of the channel width W to the channel length L(W/L) of the TFT and the vertical axis represents the ON resistance.

In FIG. 7, the broken line shows the calculated values for a specimen having a 300 nm thick semiconductor layer made of non-doped hydrogenated amorphous silicon (i layer) and the solid line shows the calculated values for a specimen having a 100 nm thick semiconductor layer of the same material, whereas ▲, ● and Δ indicate the actually measured values.

The capacitance $C_1$ is typically about several pF. The various time constants can be made smaller than 10 μsec with ease by appropriately designing the thin film transistors.

However, the ON resistance of a thin film transistor depends on the potential difference $V_d$ between the source and the drain.

Figure 8:
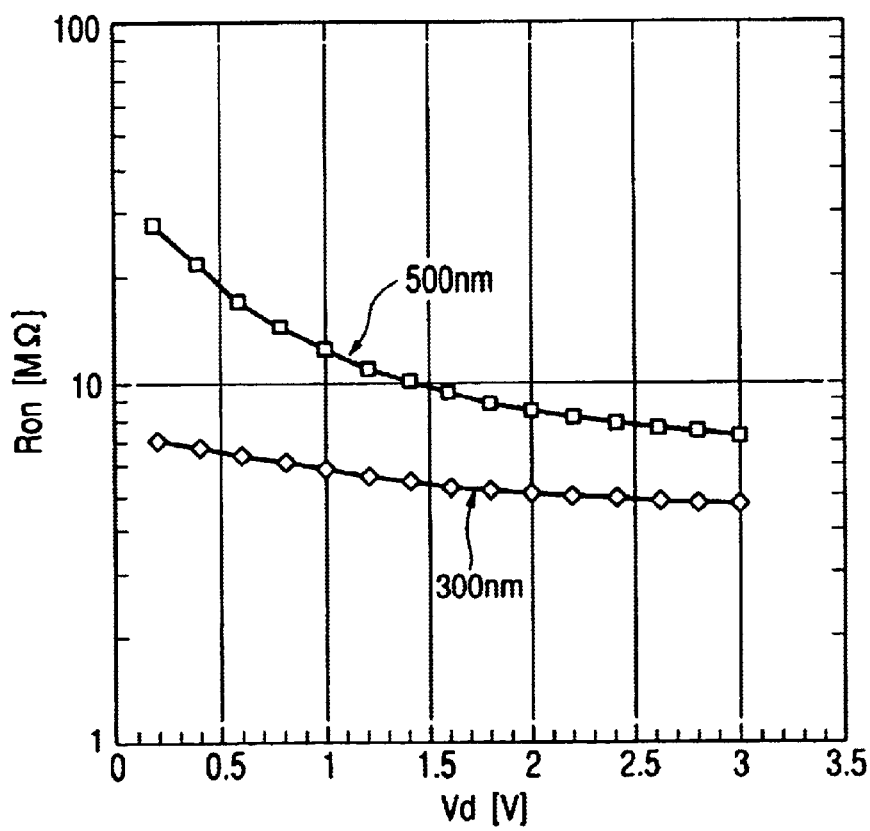
FIG. 8 is a graph showing the $V_d$ dependency of the ON resistance of a thin film transistor that can be used for the purpose of the invention.

FIG. 8 shows the $V_d$ dependency of a specimen having a 500 nm thick i layer and that of a specimen having a 300 nm thick i layer. The ON resistance rapidly increases as the value of $V_d$ falls below 1V. Therefore, the time constants can be improved remarkably by selecting a value greater than 1V for the potential difference $V_d$ between the source and the drain.

If $C_1 \ll C_2$, the capacitor 2 shows an electric potential between $V_{R1}/C_2$ and $(V_B-V_{th})/C_2$. Therefore, the voltage $V_d$ between the source and the drain of the transistor 4 operating as switch is made greater than 1V for both $V_{R1}/C_2$ and $(V_B-V_{th})/C_2$.

When $V_{R2}$ is so selected as to make $|V_B-V_{th}|+1|V_{R2}|$ hold true, signals can be read out at high speed by way of the transistor 4 under any operating conditions.

Figure 9:
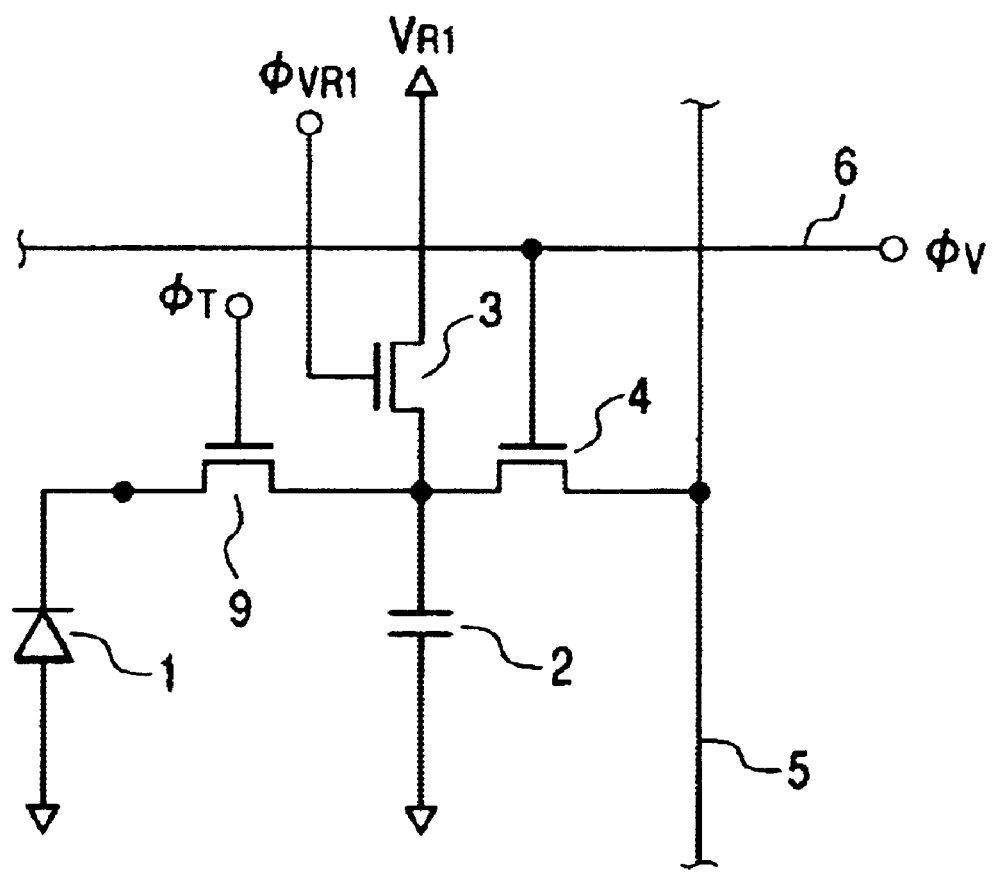
FIG. 9 is a schematic circuit diagram of a pixel of another embodiment of electromagnetic wave detector according to the invention, showing its circuit configuration.

FIG. 9 is a schematic circuit diagram of a pixel of another embodiment of electromagnetic wave detector according to the invention, showing its circuit configuration. This embodiment differs from the above described embodiment in that transistor 9 is arranged between the conversion element 1 and the capacitor 2. Otherwise, this embodiment is identical with the above embodiment. This embodiment operates in a manner as briefly described below.

Upon receiving electromagnetic waves in a state where the transistor 9 is off, an electric charge is stored in the conversion element 1. Then, the transistor 3 is turned on to reset the capacitor 2. The transistor 4 may be turned on immediately thereafter to read out the so-called reset noise to the output line 5. Alternatively, the reset noise may be read out immediately after reading out the optical signal charge, which will be described hereinafter. After the elapse of a predetermined period of time after the start of storing the photo-generated charge in the conversion element in a state where the transistor 9 is off, ON pulse $\Phi_T$ is applied to the gate of the transistor 9 to turn on the latter and transfer the electric charge to the capacitor 2. At this time, the excessive charge exceeding the saturation charge of capacitor 2 which is predetermined in the stage of designing the circuit (and may not necessarily be the absolute saturation charge that can be stored in capacitor 2) is discharged by way of the transistor 3 to the side of the reference power source that is used to supply a reset potential.

After turning off the transistor 9, the transistor 4 is turned on and the optical signal charge is read out to the output line 5. The noise of the signal can be reduced by subtracting the reset noise determined above from the read out signal.

Figure 10:
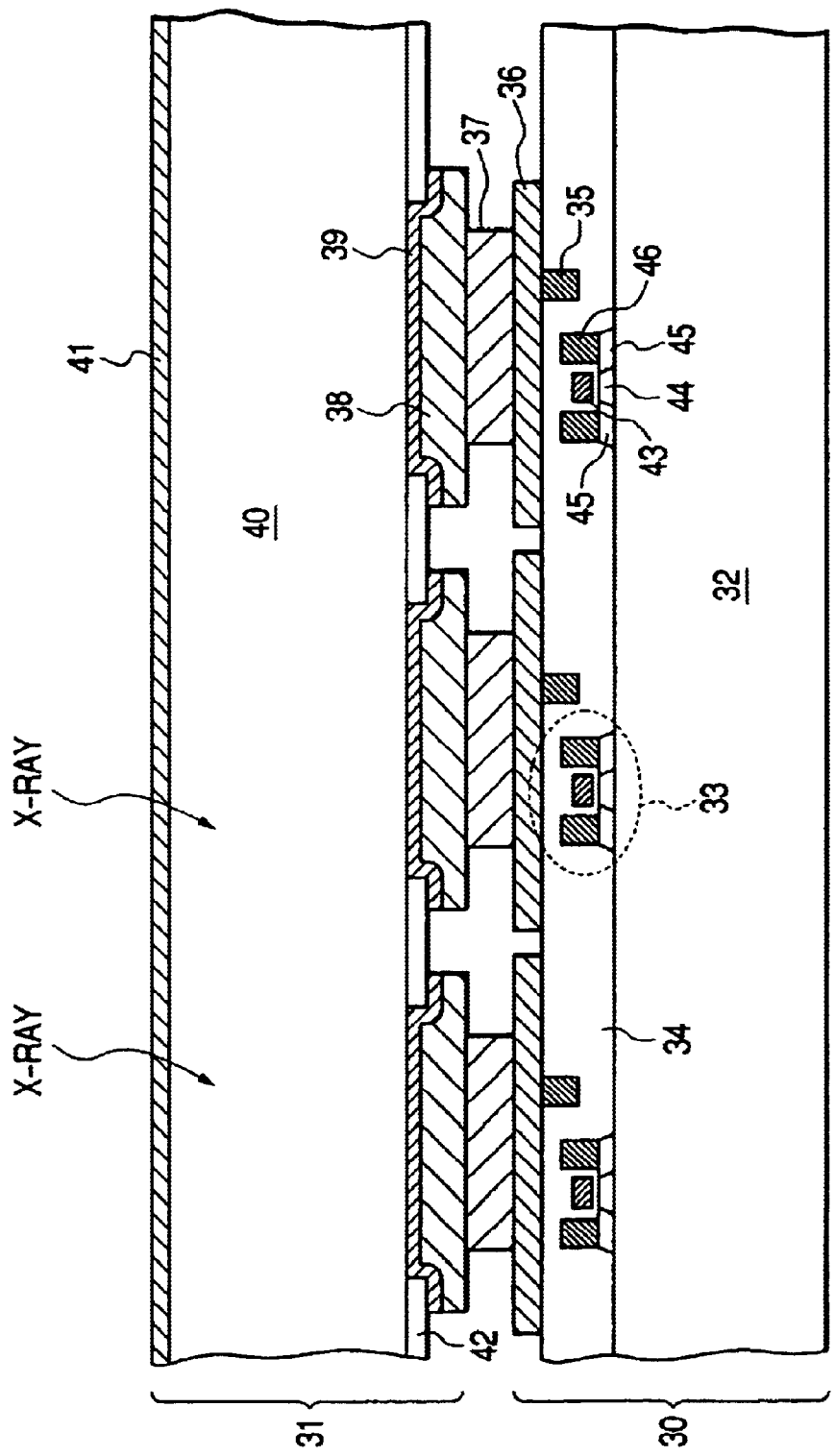
FIG. 10 is a schematic cross sectional view of a typical example of electromagnetic wave detector according to the invention.

FIG. 10 is a schematic cross sectional view of a typical example of electromagnetic wave detector according to the invention.

Referring to FIG. 10, the detector 30 comprises an insulating substrate 32 carrying thereon an array of thin film transistors 33. Note that at least the above described transistors 3 and 4 are like the thin film transistors illustrated in FIG. 10.

In FIG. 10, reference numeral 31 denotes a conversion element that comprises a semiconductor substrate 40 for receiving electromagnetic waves, a common electrode 41, individual electrodes 39 and insulating films 42. The conversion element 31 is adapted to generate electron-hole pairs by the action of the X rays it receives and store either of the carriers.

Each thin film transistor 33 comprises a gate electrode 43, a channel 44, source and drain regions 45 and source and drain electrodes 46. In FIG. 10, reference numeral 34 denotes an interlayer insulating layer and reference numeral 35 denotes a connecting electrode.

The conversion element 31 and the detector 30 are electrically and mechanically connected and secured to each other by means of metal layers 36 and 38 operating as connection pad and bumps 37, although some other form of connection may be used for the purpose of the invention.

The semiconductor substrate 40 is typically formed by using a semi-insulating GaAs monocrystalline substrate and X rays or some other radiations enter the conversion element by way of the common electrode 41 that is typically made of an AuGeNi alloy and held in ohmic contact with the substrate 40. In this embodiment, radiations are transformed into an electric charge not by means of a pn junction but in the semi-insulating substrate. The electrodes 39 typically made of an AuGeNi alloy for ohmic contact are electrically connected to the capacitor 2, the reset transistor 3 that is a thin film transistor 33 and the read transistor 4 that is also a thin film transistor and hence the generated electric charge is stored in the capacitor 2.

Figure 11:
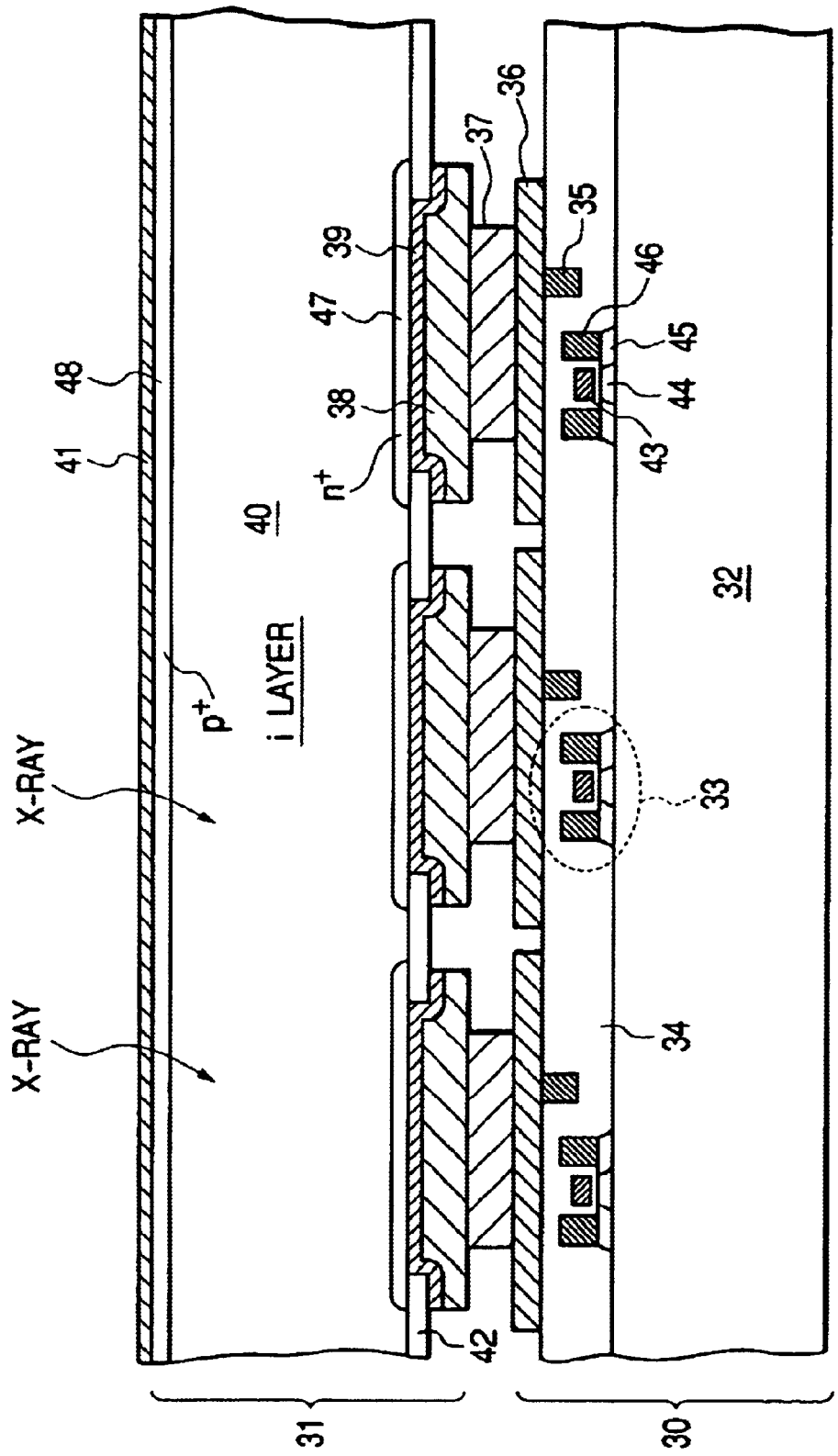
FIG. 11 is a schematic cross sectional view of another typical example of electromagnetic wave detector according to the invention.

FIG. 11 is a schematic cross sectional view of another typical example of electromagnetic wave detector according to the invention. This example differs form that of FIG. 10 in that the conversion element is a PIN junction diode. More specifically, the diode is formed by using an n+ layer 47, an i layer 40 and a p+ layer 48 that contain GaAs, GaP, Ge, Si or CdTe as principal ingredient. A depletion layer is extended in the entire i layer 40 to facilitate the collection of electric charge.

Figure 12A:
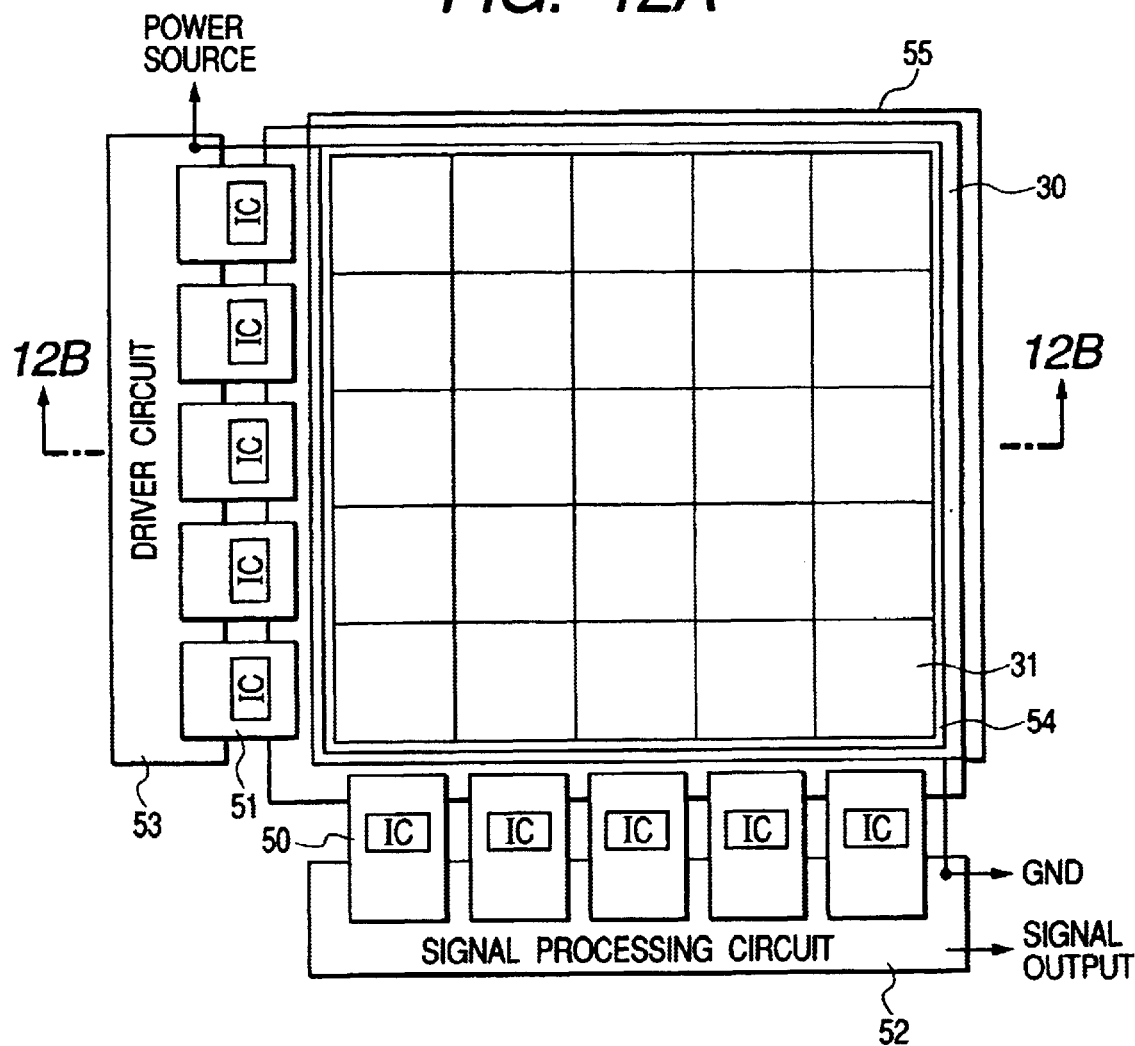
FIGS. 12A and 12B are a schematic plan view and a schematic cross sectional view of still another typical example of electromagnetic wave detector according to the invention.
Figure 12B:
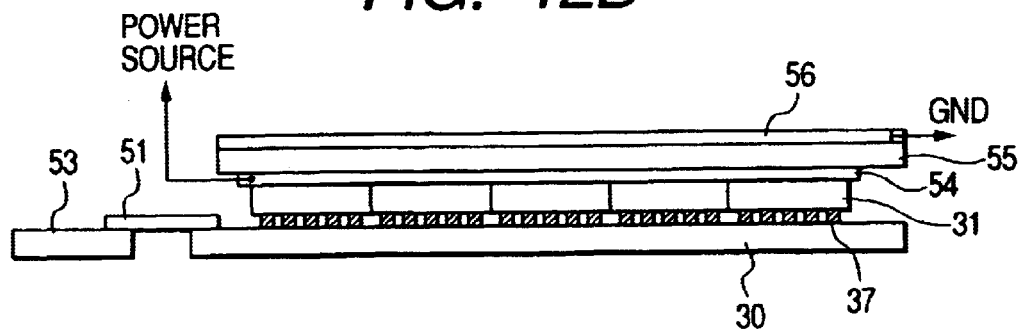

FIGS. 12A and 12B are a schematic plan view and a schematic cross sectional view of an X ray detector according to the invention.

Referring to FIGS. 12A and 12B, a plurality of conversion elements 31 are arranged in the form of a matrix on a common detector 30 comprising thin film reset transistors and thin film read transistors formed on an insulating substrate typically made of glass. Each of the conversion elements 31 and the detector 30 are connected to each other by way of bumps 37.

The signal processing circuit of the device comprises a plurality of signal processing circuit chips 50 provided in the form of tape carrier packages adapted to process signals from a predetermined number of output lines 5 and a common printed wired board 52 for connecting them. Each signal processing circuit chip 50 includes an amplifier 15, an output circuit 16 and a transistor 8, which are described earlier.

Similarly, the driver circuit of the device comprises a plurality of driver circuit chips 51 provided in the form of tape carrier packages adapted to drive a predetermined number of drive control lines 6 and 7 and a common printed wired board 53 for connecting them. Each driver circuit chip 51 includes a scan circuit 13 and a reset circuit 14.

The chips 50 and 51 are those of monolithic integrated circuits where transistors are formed in a monocrystalline semiconductor substrate.

If polycrystalline thin film transistors or monocrystalline thin film transistors are used for the thin film transistors, the signal processing circuit and the driver circuit may entirely or partly be formed by using CMOS type thin film integrated circuits comprising polycrystalline thin film transistors or monocrystalline thin film transistors arranged on the substrate 32 in such a way that they are integrated with a plurality of unit cells on the substrate 32. This arrangement is advantages that it can reduce the number of connection terminals to be used externally relative to the substrate 32 to consequently simplify the assembling operation.

In FIGS. 12A and 12B, reference numeral 54 denotes a single sheet of conductor for short-circuiting the plurality of conversion elements 31 and commonly biassing them. While the conductor 54 is in the form of a sheet here, it may alternatively realized in a meshed form. Reference numeral 55 denotes an insulating sheet and reference numeral 56 denote a sheet for shielding the biassing conductor. A high voltage above 100V is applied to the conductor 54 and hence requires a protection sheet 56. Particularly, when the detector is used for medical applications, the provision of the sheet 56 is highly desirable so that the conductor to which a high voltage is applied is held remote from any human body.

The insulating sheet 55 may not necessarily be arranged between the conductor 54 and the sheet 56. It may be replaced by an air gap. If such is the case, the shield 54 is arranged between the conductor and the housing of the detector.

Figure 14A:
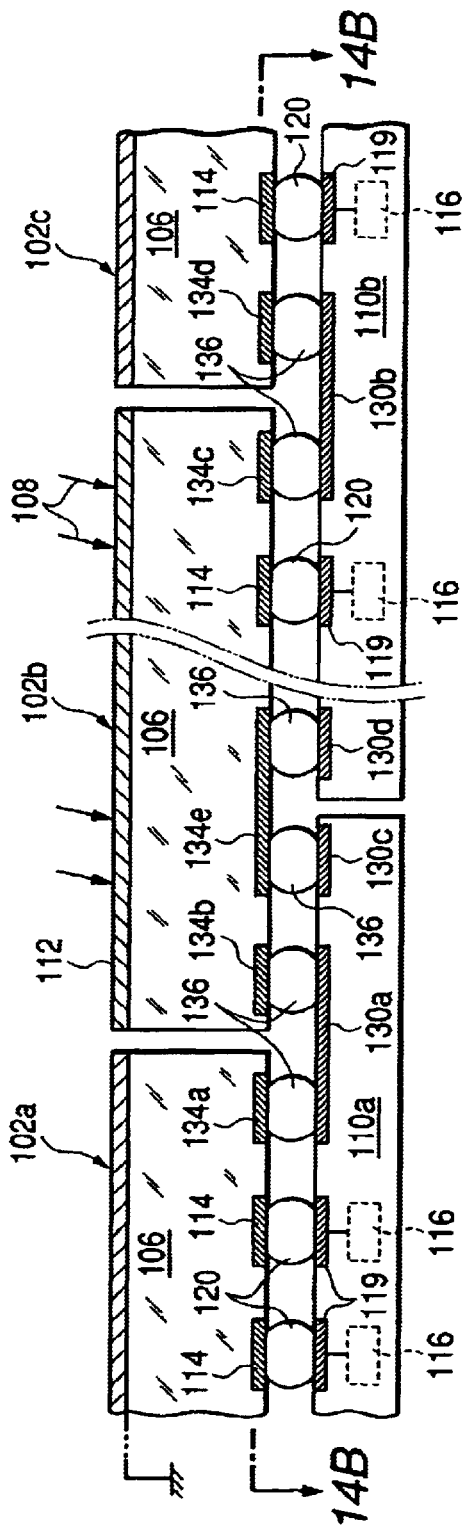
FIGS. 14A and 14B of the accompanying drawings show a schematic cross sectional view and a schematic plan view of a known detector having a layered structure of monocrystalline bulk X ray detecting sections and monocrystalline read ICs.
Figure 14B:
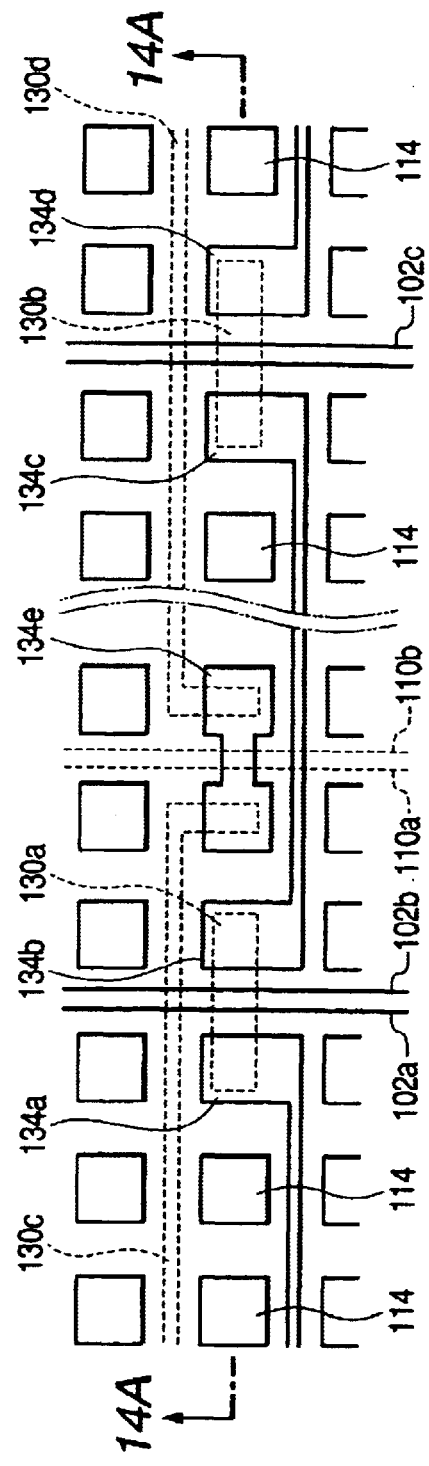
Figure 15:
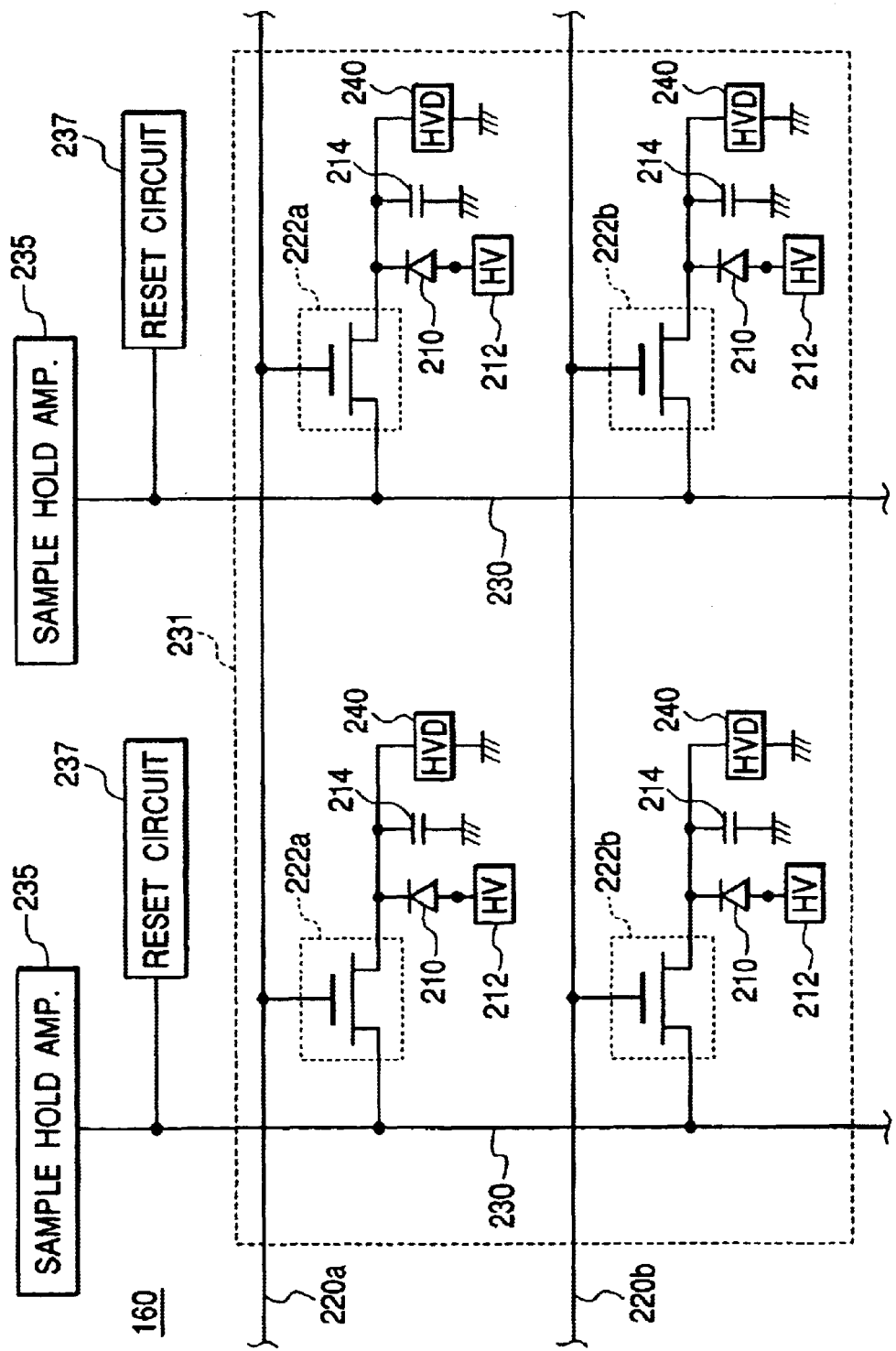
FIG. 15 is a schematic block diagram of the read/reset circuit of a known direct type sensor having protection diodes, showing its circuit configuration.
Figure 2:
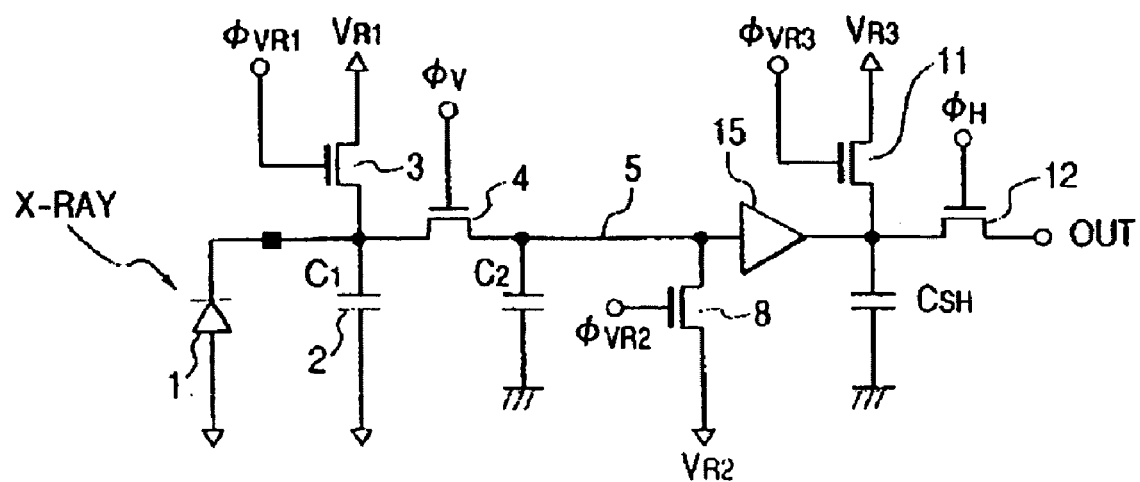
Figure 13:
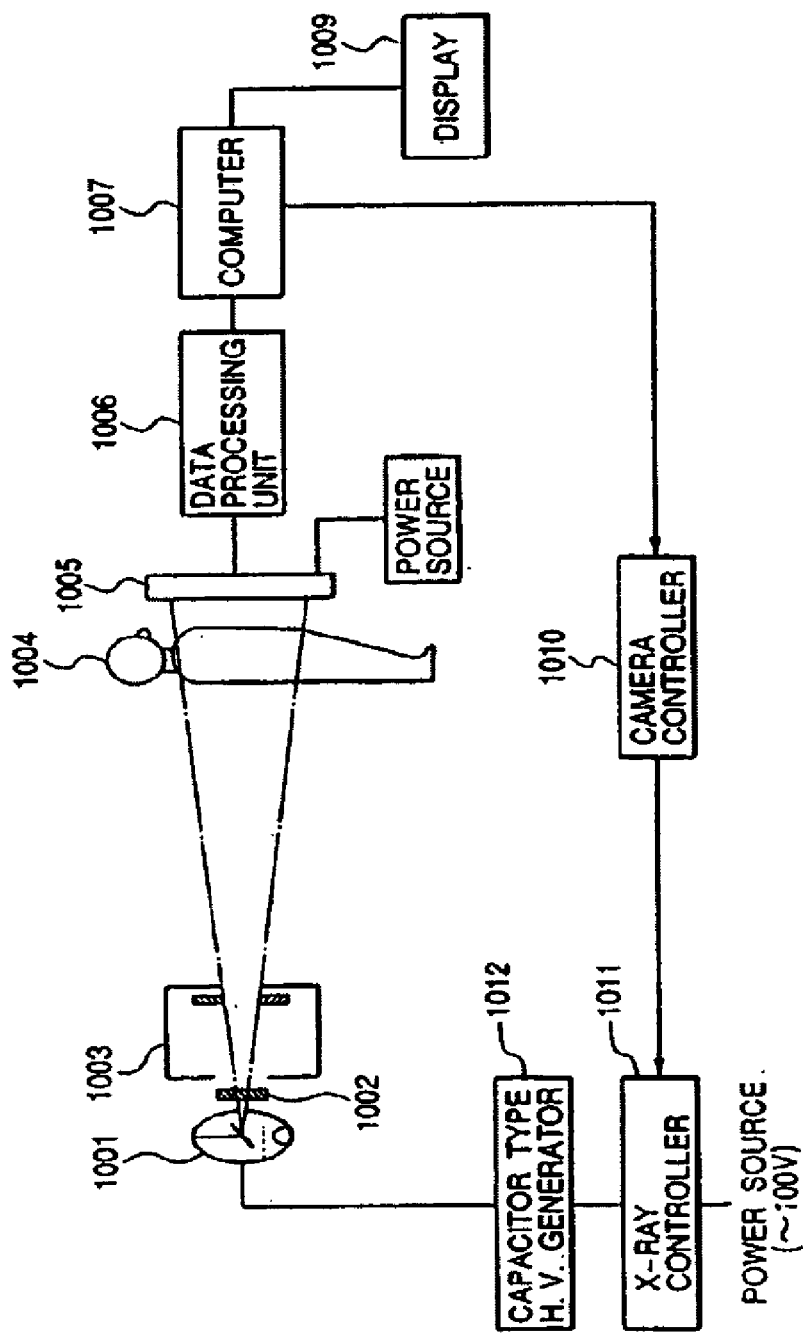
Figure 14A:
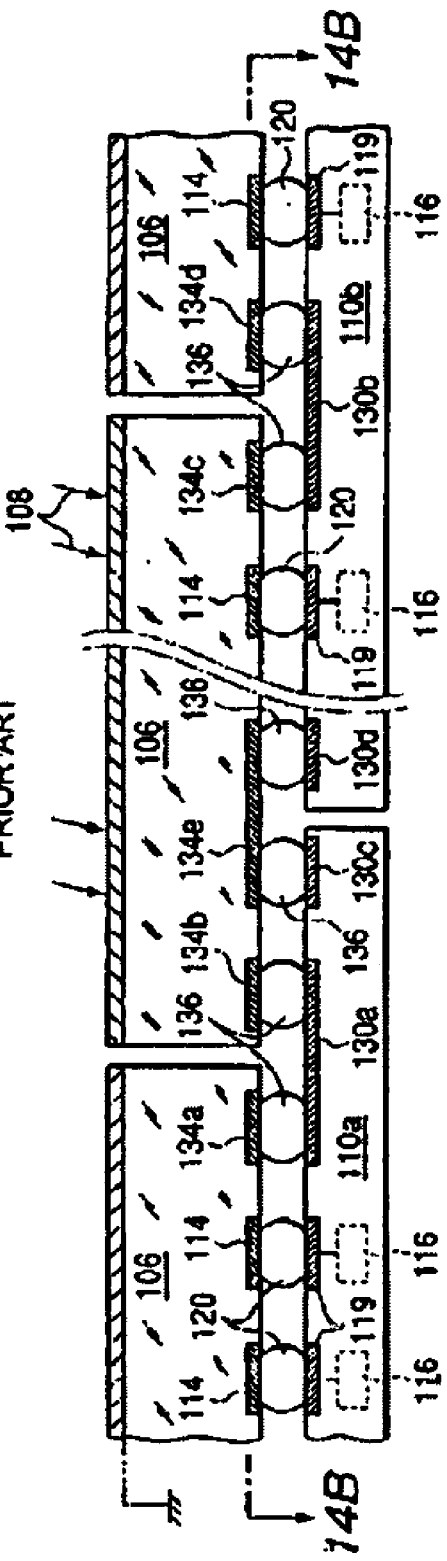
Figure 14B:
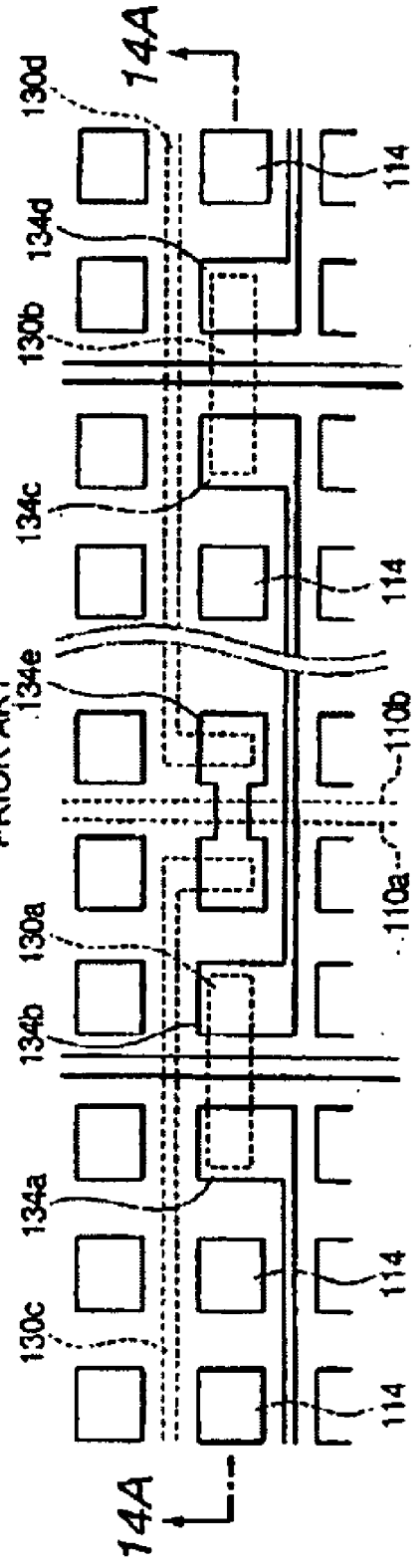
Figure 15:
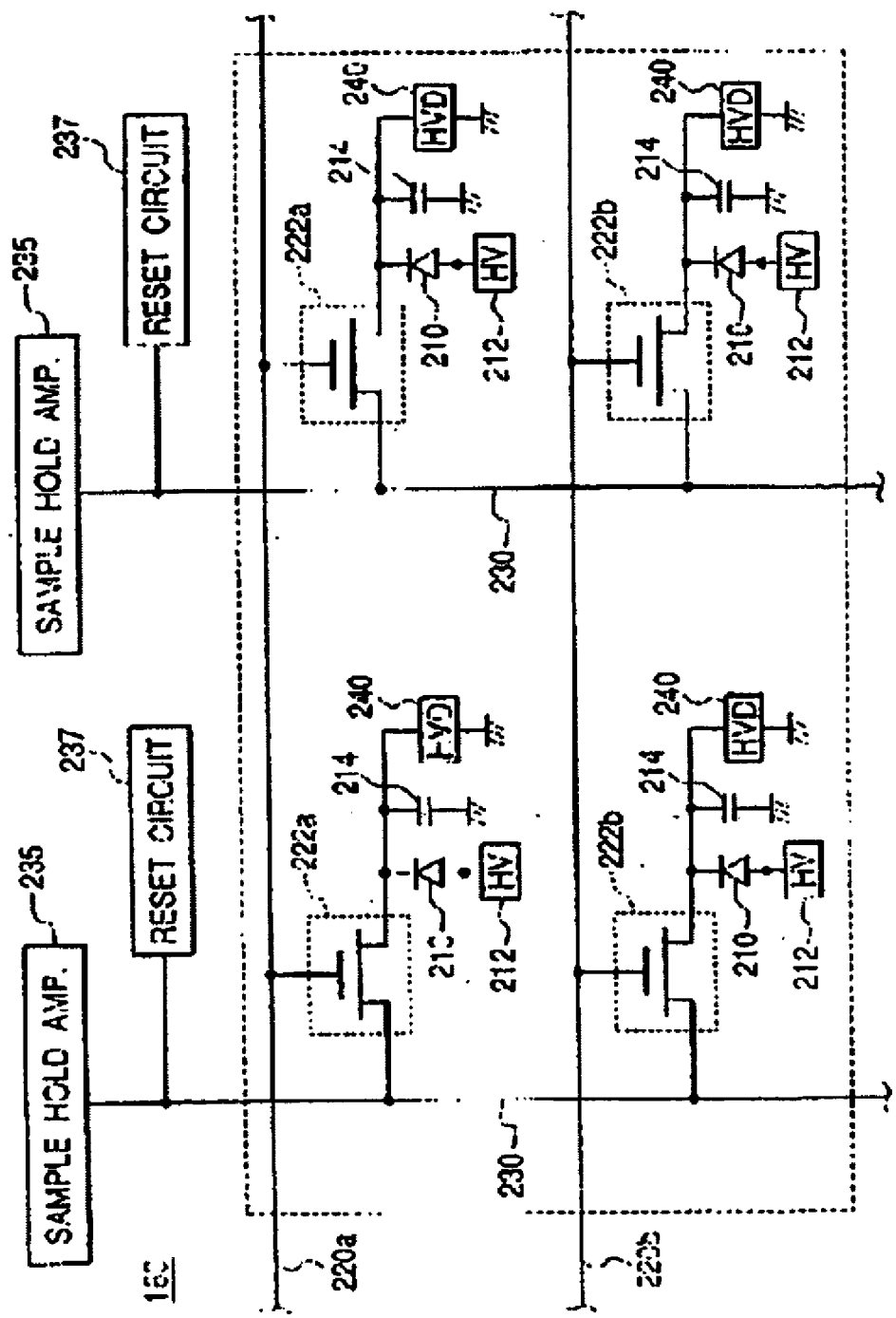

FIGS. 14A and 14B of the accompanying drawings show for the purpose of comparison a schematic cross sectional view and a schematic plan view of a detector having a layered structure of monocrystalline bulk X ray detecting sections and monocrystalline read Ics. Since the detector comprises an upper substrate and a lower substrate, which are monocrystalline substrates, it involves a complex wiring arrangement and is not adapted to up-sizing. On the other hand, any of the above described embodiments of the present invention are adapted to up-sizing.

The detector of FIGS. 14A and 14B is disadvantageous in that both the upper and lower substrates are accompanied by a multilayered wiring arrangement and it involves a complex manufacturing process with a large number of manufacturing steps to consequently reduce the manufacturing yield. Then, the wires can show a large floating capacitance to lower the detection speed of the device and reduce the electric gain. To the contrary, any of the above described embodiments of the present invention are free from these drawbacks because they utilizes thin film transistors formed on an insulating substrate.

Thus, the above described embodiments of electromagnetic wave detector according to the invention provides the following advantages.

(1) Any after image can be eliminated by the use of thin film reset transistors.

(2) The saturation voltage $V_S$ of the storage capacitor 2 can be selected to be equal to the difference of the OFF voltage of the thin film reset transistor and the threshold voltage, or $V_B - V_{th}$ so that any leakage of electric charge to the output line that can otherwise arise in response to an excessive input can be effectively prevented from occurring.

(3) Since the substrates of the conversion elements of the device are arranged two-dimensionally and a large common insulating substrate is laid thereon for the detector, an imaging device adapted to cover a large area can easily be prepared.

(4) Even if amorphous semiconductor thin film transistors showing a low carrier mobility are used, a moving image can be picked up effectively. Additionally, a still image can be picked up with an enhanced level of sensitivity and a wide dynamic range.

(5) The response time of the detector can be reduced by appropriately selecting a reset potential to make the potential difference between the source and the drain of the thin film read transistor at least greater than 1V.

(6) Since a detector according to the invention provides a high sensitivity and a wide dynamic range, it can find applications in the field of analyzers for analyzing both living things and non-living things and that of non-destructive testers in addition to medical applications.

(7) Since a detector according to the invention uses thin film transistors, the risk of operation errors that can be caused unintentionally by high energy rays can be significantly reduced.

Figure 13:
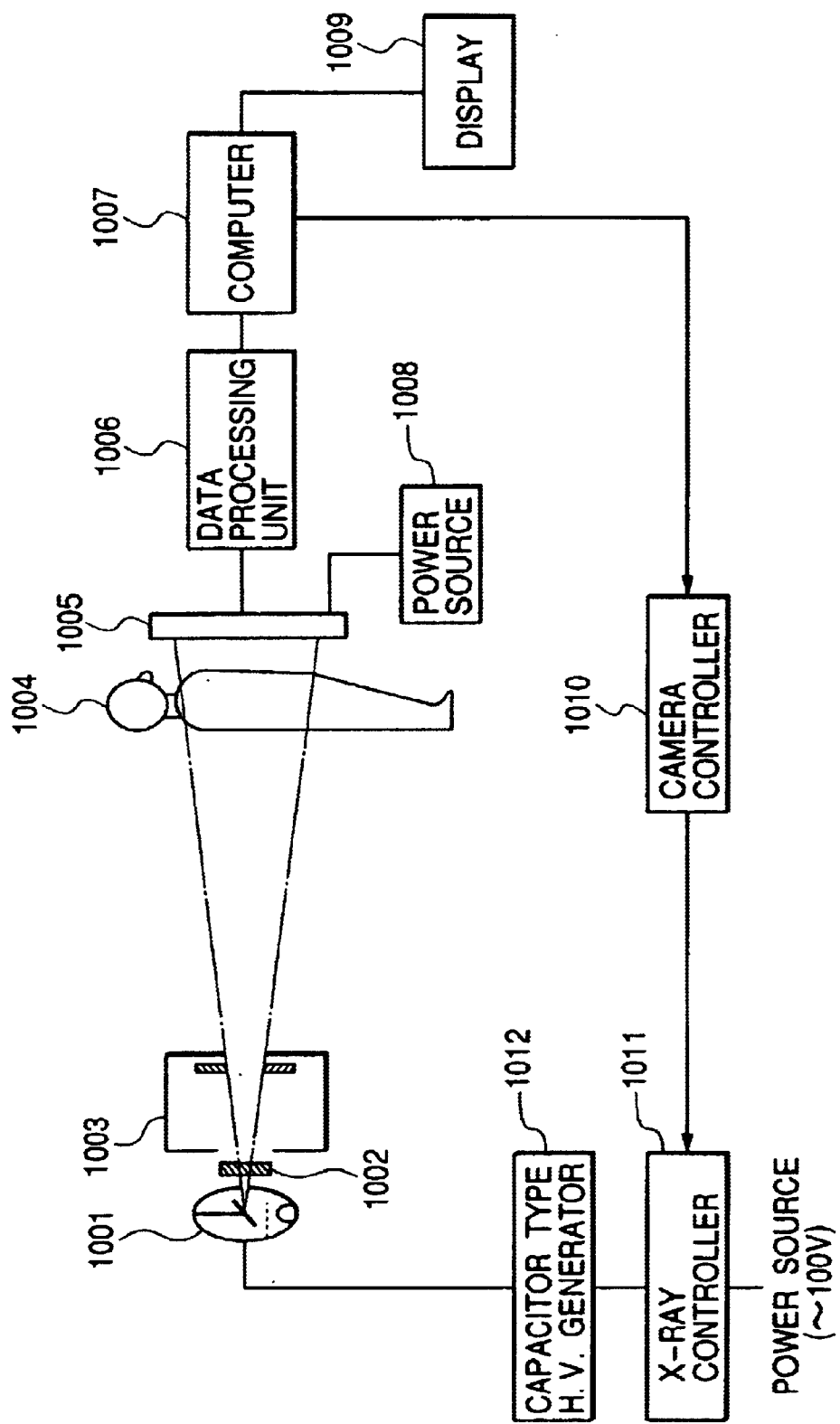
FIG. 13 is a schematic block diagram of a medical diagnostic system comprising an imaging device realized by using an electromagnetic wave detector according to the invention.

FIG. 13 is a schematic block diagram of a medical diagnostic system comprising an imaging device realized by using an electromagnetic wave detector according to the invention.

Referring to FIG. 13, there are shown an X ray tube 1001 for generating X rays, an X ray shutter 1002 for controlling the X ray path by closing and opening it, an irradiation sleeve or a movable stop 1003, a subject of examination 1004, a radiation detector 1005 realized by using an electromagnetic wave detector according to the invention, a data processing unit 1006 for processing the signals from the radiation detector 1005 as data and a computer 1007, which is adapted to display the X ray image obtained on the basis of the signals from the data processing unit 1006 on a display 1009 such as a CRT and control the rate of generation of X rays by controlling the X ray tube 1001 by way of camera controller 1010, X ray controller 1011 and capacitor type high voltage generator 1012.

High energy rays such as X rays vary enormously in terms of the amount of energy entering the conversion elements between those that have passed through the subject and those that have been transmitted through air without passing through the subject. Therefore, the electric charge generated by X rays will also vary enormously between them. Therefore, the stored electric charge can easily be saturated in the background area due to the difference in the generated electric charge between the subject and the background. However, according to the invention, since any excessive charge can be discharged through thin film transistors, the degradation of the image quality due to such an excessive charge can be effectively avoided. Additionally, since thin film transistors are used, the risk of operation errors that can be caused unintentionally by high energy rays entering the thin film transistors can be significantly reduced. Still additionally, a detector that can cover a large area can easily be realized.

Since an electromagnetic wave detector according to the invention can effectively prevent any after image and leakage of electric charges from taking place and operate without errors when high energy electromagnetic waves enter it, it can effectively detect electromagnetic waves even if they show a high energy level and hence operates excellently if compared with conventional devices. Finally, it is possible to provide an electromagnetic wave detector having a large imaging area at low cost than ever.

What is claimed is:

1. An electromagnetic wave detector comprising:
conversion elements for converting incident electromagnetic waves or radiations into an electric charge;
storage capacitors for storing the electric charge produced by said conversion elements;
thin film read transistors connected respectively to the corresponding storage capacitors, each of said read transistors having a threshold voltage and a gate to which first and second voltages are applied respectively in readout and storage periods, wherein said first voltage is higher than said threshold voltage of said read transistor; and
thin film reset transistors connected respectively to the corresponding storage capacitors, each of said reset transistors having a threshold voltage and a gate to which third and fourth voltages are applied respectively in reset and storage periods wherein said third voltage is higher than said threshold voltage of said reset transistor, and
wherein a gate potential of said read transistors and a gate potential of said reset transistors can be independently controlled, and the difference between the fourth voltage and the threshold voltage of said reset transistors is smaller than the difference between the second voltage and the threshold voltage of said read transistors.

2. An electromagnetic wave detector according to claim 1, wherein said conversion elements are adapted to absorb electromagnetic waves showing an energy level higher than visible light and convert them into an electric charge.

3. An electromagnetic wave detector according to claim 1, wherein said thin film read transistors and said thin film reset transistors have a non-monocrystalline semiconductor layer formed on an insulating substrate.

4. An electromagnetic wave detector according to claim 1, wherein said thin film read transistors and said thin film reset transistors are formed on an insulating substrate, and
wherein said conversion elements are formed on a substrate different from said insulating substrate and electrically connected to said thin film read transistors and said thin film reset transistors.

5. An electromagnetic wave detector according to claim 1, wherein said conversion elements comprise a semiconductor substrate having two opposite surfaces for converting electromagnetic waves into an electric charge, a common electrode arranged on the one surface of the semiconductor substrate and a plurality of electrodes formed on the other surface of the semiconductor substrate and separated from each other in correspondence to a plurality of two-dimensional pixels,
wherein said thin film read transistors and said thin film reset transistors are formed on an insulating substrate such that unit cells each including one of the thin film read transistors and one of the thin film reset transistors are arranged on the insulating substrate in correspondence to the pixels, and
wherein said semiconductor substrate and said insulating substrate form a layered structure and said plurality of electrodes and said unit cells are electrically connected between the substrates.

6. An electromagnetic wave detector according to claim 5, wherein said semiconductor substrate is provided in plurality as arranged two-dimensionally on said insulating substrate to form a layered structure and the common electrodes of the semiconductor substrates are mutually short-circuited.

7. An electromagnetic wave detector according to claim 5, wherein a high voltage is applied to the common electrode of said conversion elements and a shielding conductor is arranged near the commons electrode.

8. An electromagnetic wave detector according to claim 1, wherein said thin film read transistors and said thin film reset transistors are formed on an insulating substrate provided with a driver circuit for driving the thin film read transistors and the thin film reset transistors and with a read circuit for reading signals from said thin film read transistors.

9. An electromagnetic wave detector comprising:

conversion elements for converting incident electromagnetic waves or radiations into an electric charge;

storage capacitors for storing the electric charge produced by said conversion elements; and thin film reset transistors connected respectively to the corresponding storage capacitors and each having a gate to which first and second voltages are applied respectively in reset and storage periods, wherein any excessive electric charge is discharged by way of said thin film reset transistors in each storage period.

10. An electromagnetic wave detector according to claim 9, wherein said conversion elements are adapted to absorb electromagnetic waves showing an energy level higher than visible light and convert them into an electric charge.

11. An electromagnetic wave detector according to claim 9, wherein said thin film reset transistors have a non-monocrystalline semiconductor layer formed on an insulating substrate.

12. An electromagnetic wave detector according to claim 9, wherein said thin film read transistors and said thin film reset transistors are formed on an insulating substrate, and wherein said conversion elements are formed on a substrate different from said insulating substrate and electrically connected to said thin film read transistors and said thin film reset transistors.

13. An electromagnetic wave detector according to claim 9, wherein said conversion elements comprises a semiconductor substrate having two opposite surfaces for converting electromagnetic waves into an electric charge, a common electrode arranged on the one surface of the semiconductor substrate and a plurality of electrodes formed on the other surface of the semiconductor substrate and separated from each other in correspondence to a plurality of two-dimensional pixels, wherein thin film read transistors and said thin film reset transistors are formed on an insulating substrate such that unit cells each including one of the thin film read transistors and one of the thin film reset transistors are arranged on the insulating substrate in correspondence to the pixels, and wherein said semiconductor substrate and said insulating substrate form a layered structure and said plurality of electrodes and said unit cells are electrically connected between the substrates.

14. An electromagnetic wave detector according to claim 13, wherein said semiconductor substrate is provided in plurality as arranged two-dimensionally on said insulating substrate to form a layered structure and the common electrodes of the semiconductor substrates are mutually short-circuited.

15. An electromagnetic wave detector according to claim 13, wherein a high voltage is applied to the common electrode of said conversion elements and a shielding conductor is arranged near the common electrode.

16. An electromagnetic wave detector according to claim 9, wherein thin film read transistors and said thin film reset transistors are formed on an insulating substrate provided with a driver circuit for driving the thin film read transistors and the thin film reset transistors and with a read circuit for reading signals from said thin film read transistors.

\* \* \* \* \*

UNITED STATES PATENT AND TRADEMARK OFFICE
CERTIFICATE OF CORRECTION

PATENT NO.     : 6,855,935 B2
DATED          : February 15, 2005
INVENTOR(S)    : Masakazu Morishita It is certified that error appears in the above-identified patent and that said Letters Patent is hereby corrected as shown below:

Delete drawing figures 2, 13, 14A, 14B and 15, and replace with drawing figures 2, 13, 14A, 14B, and 15 on the attached sheets.

Signed and Sealed this

Seventh Day of March, 2006

JON W. DUDAS
*Director of the United States Patent and Trademark Office*